United States Patent [19]
Hung et al.

[11] Patent Number: 5,430,687
[45] Date of Patent: Jul. 4, 1995

[54] PROGRAMMABLE LOGIC DEVICE INCLUDING A PARALLEL INPUT DEVICE FOR LOADING MEMORY CELLS

[75] Inventors: Lawrence C. Hung, Los Gatos; Charles R. Erickson, Fremont, both of Calif.

[73] Assignee: Xilinx, Inc., San Jose, Calif.

[21] Appl. No.: 223,247

[22] Filed: Apr. 1, 1994

[51] Int. Cl.⁶ .............................................. G11C 13/00
[52] U.S. Cl. ................................ 365/230.08; 365/78; 365/189.04; 365/189.12
[58] Field of Search ................. 365/63, 78, 189.01, 365/230.01, 230.08, 231, 189.02, 189.03, 189.04, 189.05, 189.12

[56] References Cited

U.S. PATENT DOCUMENTS

| | | | |
|---|---|---|---|
| Re. 34,363 | 8/1993 | Freeman | 307/465 |
| 4,124,899 | 11/1978 | Birkner et al. | 364/716 |
| 4,330,852 | 5/1982 | Redwine et al. | 365/221 |
| 4,706,216 | 11/1987 | Carter | 365/94 |
| 4,750,155 | 6/1988 | Hsieh | 365/203 |
| 4,758,745 | 7/1988 | Elgamal et al. | 307/465 |
| 4,821,233 | 4/1989 | Hsieh | 365/203 |
| 4,870,302 | 9/1989 | Freeman | 307/465 |
| 5,148,390 | 9/1992 | Hsieh | 365/95 |
| 5,198,705 | 3/1993 | Galbraith et al. | 307/465 |
| 5,243,238 | 9/1993 | Kean | 307/465 |
| 5,258,668 | 11/1993 | Cliff | 307/465 |
| 5,260,611 | 11/1993 | Cliff | 307/465 |
| 5,260,881 | 11/1993 | Agrawal et al. | 364/489 |
| 5,267,187 | 11/1993 | Hsieh | 364/784 |
| 5,280,202 | 1/1994 | Chan | 307/465 |

FOREIGN PATENT DOCUMENTS

WO93/05577 8/1992 WIPO.

Primary Examiner—Terrell W. Fears
Attorney, Agent, or Firm—Edel M. Young; Greg T. Sueoka

[57] ABSTRACT

A device for configuring portions of an array of memory cells for a programmable logic device comprises a data register, a plurality of shift registers and a control unit. The data are loaded into and out of the data register in parallel. Each of the outputs of the data register is coupled to a serial input of a respective shift register so the data can be shifted into the shift registers at the same time. A clock signal is applied by the control unit to the shift registers for serially loading the plurality of shift registers in parallel. The clock signal and the load signal are preferably applied simultaneously until the plurality of shift registers store a column of data to be transferred to the memory cells. The plurality of shift registers each have a plurality of data outputs. Each of the data outputs is coupled to a different row of memory cells. The control unit then generates an address signal to transfer the column of data held in the plurality of shift registers into the memory cells.

17 Claims, 15 Drawing Sheets

Prior Art Data Shift Register Bit

Data Shift Register Bit

PROGRAMMABLE LOGIC DEVICE INCLUDING A PARALLEL INPUT DEVICE FOR LOADING MEMORY CELLS

CROSS-REFERENCE TO RELATED APPLICATIONS

This application relates to the following concurrently filed and commonly assigned co-pending U.S. patent applications:

1. Ser. No. 08 222138 invented by Danesh Tavana, Wilson Ko Yee, and Victor A. Holen entitled "TILE BASED ARCHITECTURE FOR FPGA",
2. Ser. No. 08 221679 invented by Danesh Tavana entitled "I/O INTERFACE CELL FOR USE WITH OPTIONAL PAD",
3. Ser. No. 08 223391 invented by Wilson K. Yee entitled "FIELD PROGRAMMABLE GATE ARRAY PROVIDING CONTENTION FREE CONFIGURATION AND RECONFIGURATION",
4. Ser. No. 08 223083 invented by Wilson K. Yee entitled "A PROGRAMMABLE SCAN-CHAIN TESTING STRUCTURE AND METHOD",
5. Ser. No. 08 222141 invented by Lawrence C. Hung entitled "A PROGRAMMABLE LOGIC DEVICE WITH PARTIALLY CONFIGURABLE MEMORY CELLS AND A METHOD FOR CONFIGURATION", all of which are incorporated herein by reference.

BACKGROUND OF THE INVENTION

1. Field of the Invention

This invention relates generally to programmable logic devices, and in particular to a device for loading data into an array of memory cells for a field programmable gate array.

2. Description of the Related Art

Field programmable gate arrays (FPGAs) typically include an array of memory cells for storing data that configures or defines the operation of the FPGA. The memory cells are typically static random access memory (SRAM) cells. FPGAs generally include an array of logic cells that are arranged in rows and columns. Each logic cell of a tile based SRAM FPGA comprises a configurable logic block and a programmable routing matrix, and has a group of configuration memory cells associated with it. The logic block responds to data inputs of the logic cell and generates the outputs of the logic cell. Each configurable logic block may perform any one of a variety of logic functions. The logic function performed by a particular logic block is defined by data stored in its associated group of configuration memory cells. The programmable routing matrix allows the inputs and outputs of the logic block to be coupled to the inputs and outputs of other logic blocks or the inputs and outputs of the FPGA. The couplings of the inputs and outputs of a particular logic block are similarly defined by data stored in its associated group of configuration memory cells. FPGAs also may include data storage memory cells, latches or flip-flops. However, the discussion of memory cells here will refer to configuration memory cells. The output of each memory cell may be set either high or low by storing a corresponding bit in the memory cell. Each memory cell is set using a configuration means. Setting all the memory cells of the FPGA is called configuring the FPGA. The data stored in the memory cells may be changed, or re-programmed, to modify the function of the FPGA. Storing a new set of data in the memory cells is referred to as reconfiguring the FPGA.

One problem with many existing FPGAs is that all the memory cells in the FPGA must be re-written in order to change the configuration of the FPGA. Programmability is a major feature of FPGAs and reconfiguration is particularly important during quality control testing of SRAM FPGAs. In order to test fully the FPGA, the manufacturer must repeatedly reconfigure the memory cells to test that the logic cell can perform all of the possible predetermined functions. Moreover, the memory cells are volatile memories. Therefore, the entire array of memory cells must be configured each time the FPGA is powered on.

The memory cells of the FPGA are arranged as an array of cells in columns and rows. The FPGA typically provides a single address register and a single data register for loading configuration data into memory cells. The data register is typically a serial input shift register. The use of a single address register and a single data register for accessing the memory cells saves space on the FPGA, which is critical since space is severely limited. However, the use of serial input shift registers increases the time required to load new configuration data into the memory cells in comparison to a parallel loading means.

The array of memory cells is reconfigured by loading data one row or column at a time. In the prior art, the data for each column of memory cells is loaded serially into a data shift register. When the data shift register is full, the data are transferred in parallel into the memory cells of a selected column of the array. Each stage of the shift register is coupled to a corresponding row of memory cells of the array. Thus, the first stage of the data shift register is coupled to the first memory cell of each column of the array. The FPGA selects a column of the array using the address register. The data shift register loads its data into the column of the array selected by the address register. Thus, if the configuration data are being loaded one bit per clock cycle, a number of clock cycles equal to the number of memory cells in a column of the array is the minimum number required to load data into a column of the array.

A typical FPGA can have more than a hundred thousand memory cells that must be written in order to configure the FPGA. Since each memory cell must be written to when the FPGA is reconfigured, the time required can be undesirably long. A column of the array may be hundreds of memory cells in length. The serial input to the data shift register requires at least this number of clock cycles to load a column of data into the data register and then into the array of memory cells. The time required to reconfigure an array is a particular problem during quality control testing since the array of memory cells must be repeatedly reconfigured. The time required for reconfiguration adds significant delay and expense to the testing of FPGAs. Further, some FPGA applications require that the FPGA be repeatedly and rapidly reconfigured during operation. Thus, there is a need for a device that reduces the time required to reconfigure FPGAs.

SUMMARY OF THE INVENTION

The present invention overcomes the limitations and shortcomings of the prior art with a field programmable gate array which includes a parallel input device for loading memory cells. The apparatus of the present invention includes an array of logic blocks, an array of corresponding memory cells, an addressing means and a configuration means. In a first embodiment, the configuration means comprises a data register, a first shift register, a second shift register, and a control unit. The control unit generates a load signal for parallel loading the data register. The inputs of the data register are coupled to receive a multiple bit word that is a portion of the column of data to be loaded into a corresponding column of memory cells. Each output of the data register is coupled to a respective serial input of either the first shift register or second shift register. A clock signal or signals are applied by the control unit to the shift registers for serially loading the first and second shift registers in parallel. The load signal and the clock signal are repeatedly applied to load the data register and to shift data into the first and second shift registers, respectively, until the first and second shift registers store a column of data to be transferred to the memory cells. The first and second shift registers each have a plurality of data outputs. Each of the data outputs may be coupled to a different row of memory cells or multiple rows. The control unit then generates an address signal to load the column of data into the memory cells.

In a second embodiment, the data register is an eight bit, parallel input, parallel output data register, and the configuration means comprises eight shift registers. The serial input of each shift register is coupled to a different output of the data register. The shift registers are preferably serial in, parallel out shift registers. The shift registers each have n/8 stages (data outputs), where n is the number of rows of memory cells in the array of memory cells. Each data output of the shift registers is coupled to a different row of memory cells. The preferred embodiment advantageously reduces the amount of time required to load a column of data in the memory cells with a minimum increase in the configuration logic and interconnecting structures.

The same data register may also be used for reading back data from the configuration memory if structures are provided for shifting the data out and for detecting when a column of data has been shifted out of the data register.

DESCRIPTION OF THE PREFERRED EMBODIMENTS

Figure 1:
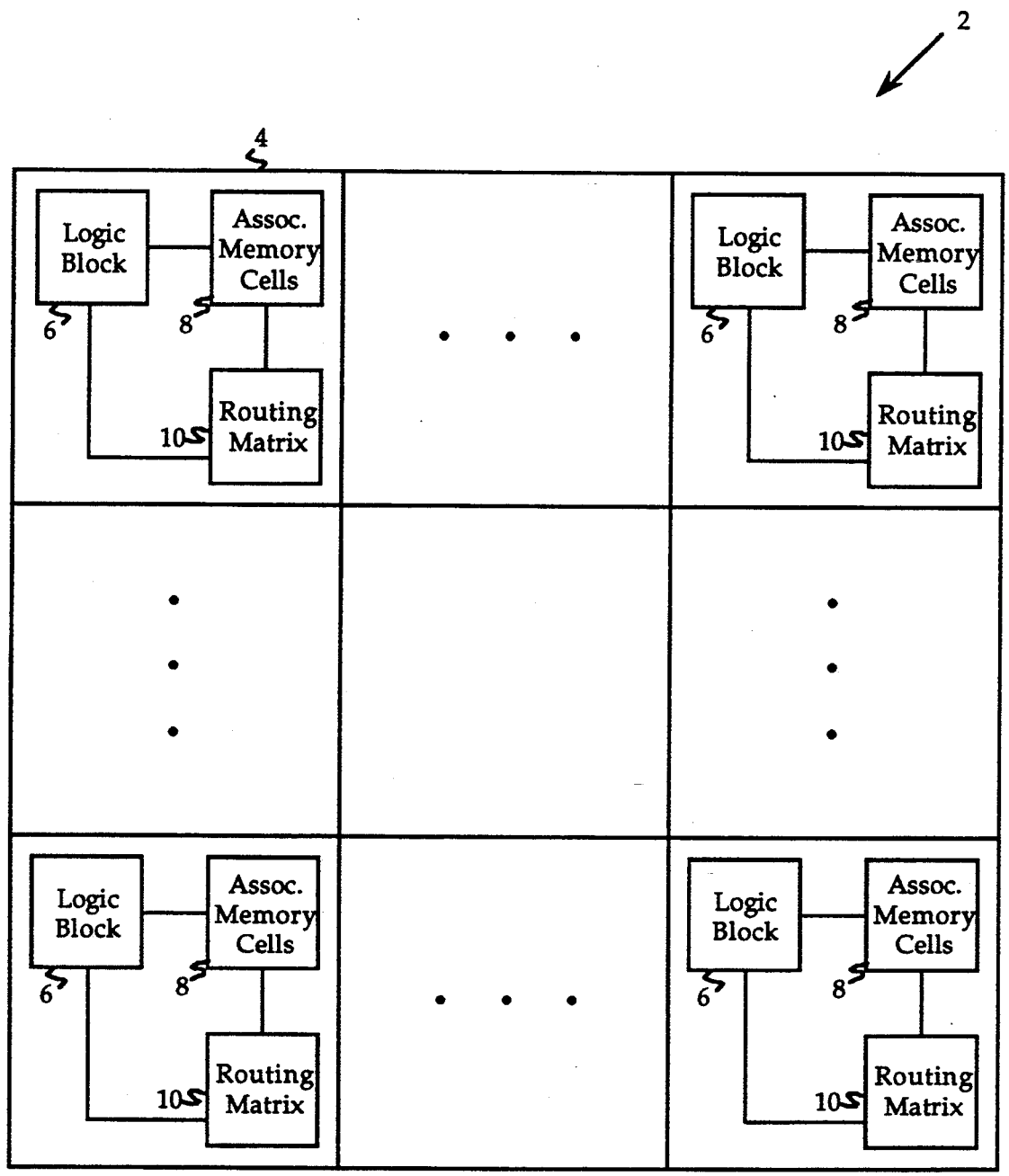
FIG. 1 is a block diagram showing one embodiment of a field programmable gate array according to the present invention.

FIG. 1 shows a block diagram of embodiment of an FPGA 2 with which the invention may be used. FPGA 2 comprises a plurality of gate array cells 4. Each gate array cell 4 in turn comprises a logic block 6, a routing matrix 10 and associated memory cell group 8. Logic block 6 is preferably a logic block that can be configured to perform one of a variety of logical functions. For example, logic block 6 may be configured to be a wide AND gate decoder, a multi-bit adder, a multi-input combinational function generator, or any of several million devices. Logic block 6 is configured by storing data in the associated memory cell group 8 for logic block 6. Transistor gates in logic block 6 are coupled to associated memory cell group 8 for being controlled by configuration data that specifies the function logic block 6 is to perform. Routing matrix 10 is used to couple the inputs and outputs of logic block 6 with the inputs and outputs of other logic blocks 6 for creating complex circuits on FPGA 2. Routing matrix 10 is also coupled to associated memory cell group 8 and is controlled by configuration data that are applied to the inputs of routing matrix 10 so that the inputs and outputs of logic block 6 are coupled as desired.

Figure 2:
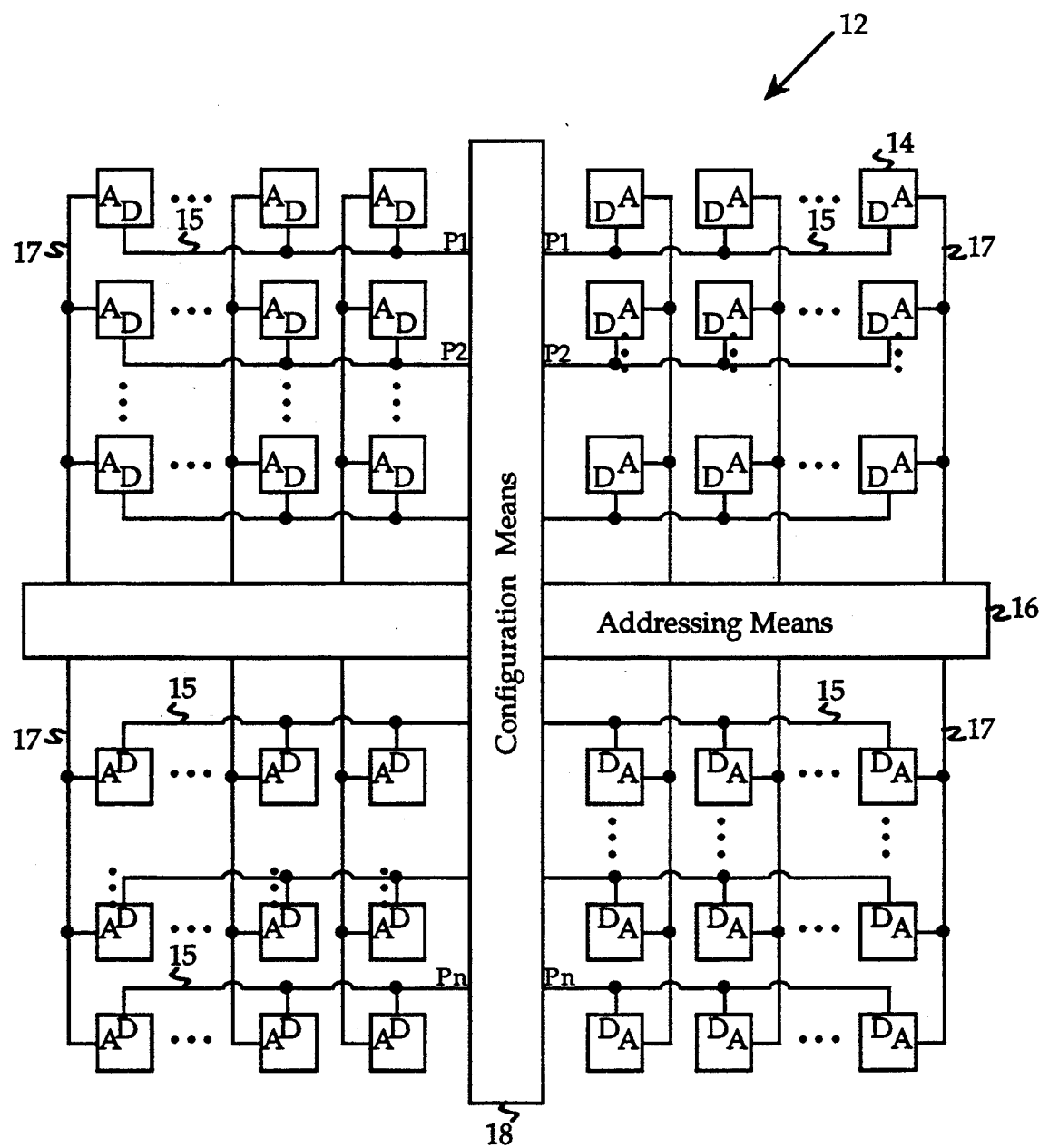
FIG. 2 is a block diagram showing one embodiment of an array of memory cells for the field programmable gate array arranged according to the present invention.

Associated memory cell group 8 shown in FIG. 1 are preferably a group or section of memory cells 14 from an array 12 of memory cells 14 (See FIG. 2). Memory cells 14 are preferably arranged in array 12 in rows and columns. In one embodiment of FPGA 20 logic block 6, routing matrix 10, and associated memory cell group 8 of each gate array cell 4 are grouped together physically near each other across FPGA 2. This is advantageous because it reduces the amount of wiring need. These components 6, 8, 10 may, however, be separated from each other or arranged in other configurations without departing from the spirit of the present invention. In any case, the electrical correspondence among components 6, 8, 10 is maintained. Thus, for each gate array cell of an FPGA there is a specific logic block 6, a specific memory cell group 8, and a specific routing matrix 10. The memory cells, however, may be physically grouped together in one large array of memory cells whether or not the components of each gate array cell are separated. This large array of memory cells may be either separated from the logic blocks or may be integrated with the logic blocks and routing matrices. Actual FPGAs can be very large, comprising hundreds of gate array cells. An exemplary FPGA has an array of 20 by 20 gate array cells, each gate array cell having an associated group of about 408 memory cells. Thus, there are 163,200 memory cells in the array of memory cells for this FPGA.

CONFIGURATION MEMORY ARRAY

Figure 2A:
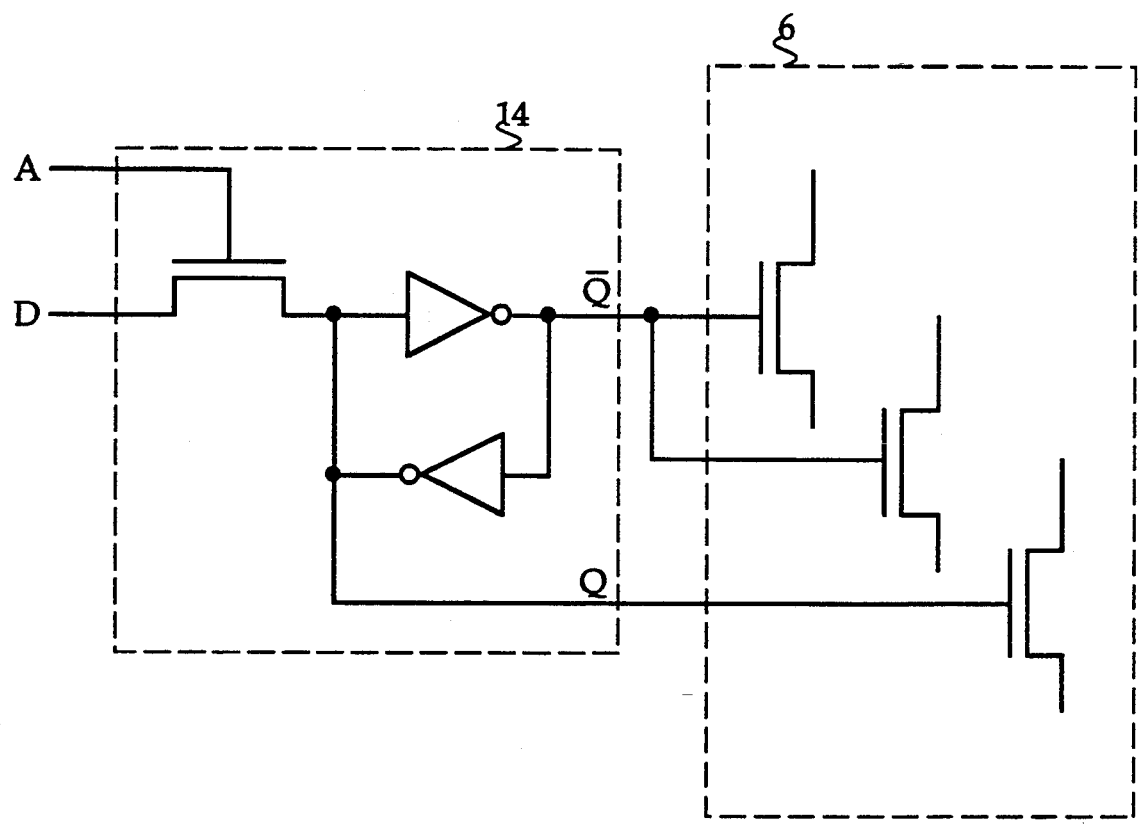
FIG. 2A is a schematic diagram of one embodiment of the memory cell of FIG. 2 coupled to the gates of transistors in a logic block.

Referring now to FIG. 2, a block diagram of one embodiment of this single array 12 of memory cells 14 is shown. This embodiment comprises a plurality of memory cells 14, an addressing means 16, and a configuration means 18. Memory cells 14 are arranged in rows and columns. Each memory cell 14 has two inputs. One input, labeled D in FIG. 2, is a data input and is coupled to configuration means 18. The other input, labeled A in FIG. 2, is an address input and is coupled to addressing means 16. A signal applied on address input A controls when data on data input D will be loaded or stored into memory cell 14. In addition, each memory cell 14 has outputs that are coupled to the appropriate logic block 6. FIG. 2A shows a memory cell 14 with its data input D, its address input A, and its outputs Q and $\overline{Q}$ coupled to the gates of transistors in logic block 6. This memory cell is further discussed in U.S. Pat. Nos. 4,750,155, 4,821,233 and 5,148,390 which are incorporated herein by reference. Memory cells 14 are preferably static random access memory cells, however, those skilled in the art will realize that memory cells 14 may be implemented with other equivalent circuits such as an array of D-flip-flops or EEPROM cells.

The present invention also provides a plurality of row buses 15 and column buses 17 for coupling the data inputs and the address inputs, respectively. In the embodiment of FIG. 2, each row bus 15 is coupled to the data input of each memory cell 14 in a row. Thus, there is one row bus 15 for each row of memory cells 14 in array 12. Similarly, each column bus 17 is coupled to the address input of each memory cell 14 in a column. There is one column bus 17 for each column of memory cells 14 in array 12. Thus, each time the address signal is asserted on a column bus 17, all the memory cells 14 in that column are loaded or written. Therefore, an entire column of data can be written to array 12 simultaneously when an address is asserted.

The address means 16 specifies the column of array 12 that is to be loaded with data from configuration means 18. Address means 16 is preferably a shift register having a serial data input, an address increment input, an address strobe input, an address empty output, and a plurality of address outputs. Address means 16 preferably has a number of stages equal in number to the number of columns in array 12. Each stage stores a bit that specifies whether a particular column is to be addressed. Each stage also provides one of the plurality of address outputs. Each of the plurality of address outputs is coupled by a respective column bus 17 to the address input of memory cells 14 in a respective column of array 12. For example, a first output of address means 16 is coupled to the address inputs of memory cells 14 in the first column of array 12. A second address output of address means 16 is coupled to the address inputs of memory cells 14 in the second column of array 12. Each subsequent column of memory cells 14 of array 12 is similarly coupled to a respective address output of address means 16. The address increment input provides a way of incrementing address means 16.

When an address increment signal is applied to the address increment input of address means 16, the data are shifted one stage and the data on the serial input are loaded into the first stage. In an exemplary embodiment, initially address means 16 would be cleared indicating that no column is addressed. Then an asserted bit, either logic high or logic low but opposite to the cleared value, is applied to the serial input of address means 16, and subsequently address means 16 is incremented by applying an address increment signal ARCLK. The asserted bit is shifted into the first stage of address means 16, thereby addressing the first column of array 12. Subsequently, non-asserted bits, the logical opposite of the asserted bit, are serially loaded into address means 16. Thus, each time address means 16 is incremented, the asserted bit is shifted which causes the next column to be addressed. The present invention advantageously includes an address strobe input for controlling whether the data in address means 16 are applied to the plurality of address outputs. This is particularly advantageous because only when the address strobe signal is applied will the address stored in address means 16 be applied to memory cells 14 of array 12.

PRIOR ART DATA SHIFT REGISTER

Figure 3:
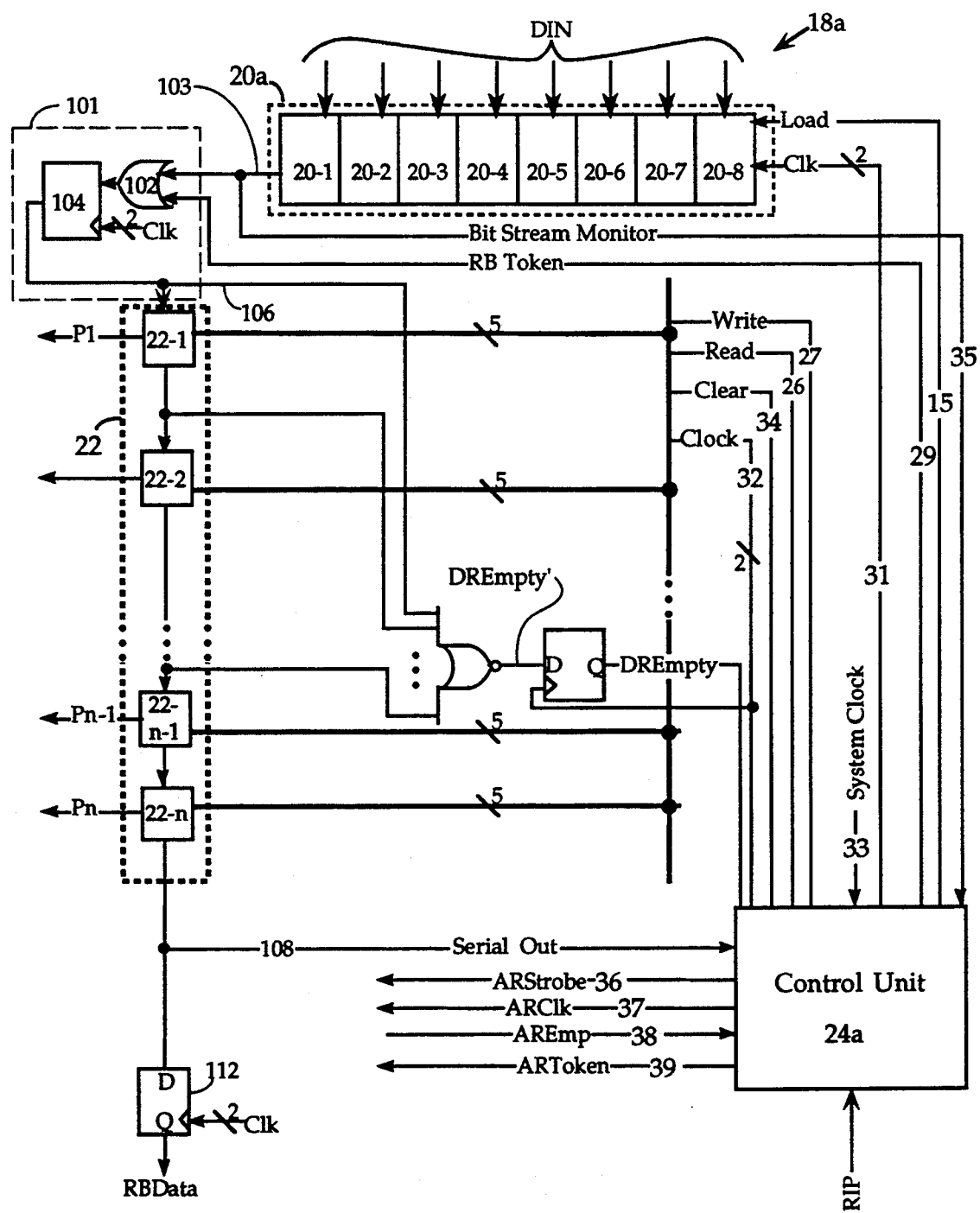
FIG. 3 is a block diagram showing a prior art configuration means for an array of static random access memory cells.

Referring now to FIG. 3, a block diagram of a prior art configuration means 18a is shown. The prior art configuration means 18a comprises a data input register 20a, a read-back select unit 101, a data shift register 22, a readback data flip flop 112, and a control unit 24a.

The data input register 20a is a parallel in, serial out shift register having eight stages 20-1 through 20-8. Data input register 20a has eight data input terminals DIN, two clock input terminals 31, a load input terminal 15, and a serial output terminal 103. The data to be stored in memory cells 14 are applied to the eight data input terminals DIN for loading. The data are loaded in parallel, eight bits at a time, through the input terminals of data input register 20a. The data are then serially transferred out of data input register 20a onto terminal 103. The output of a first stage 20-1 is the serial output of data input register 20a.

Data are transferred out of data input register 20a through OR gate 102 into flip flop 104 and from there into shift register 22. Shift register 22 comprises a plurality of stages 22-1 through 22-n, and is a serial-in, parallel-out shift register. Shift register 22 receives a two-phase clock signal on a bus 32, a clear input signal on line 34, a data input signal on line 106, and provides a serial data output signal (Serial Out) on line 108, and a plurality of parallel data output signals on lines P1 through Pn. There is a stage for each row of memory cells 14 in array 12. Stages 22-1 through 22-n shift data one stage down for each cycle of the clock signal on bus 32. The data input terminal of shift register 22 is coupled to line 106. As shown in FIG. 2, each of the plurality of parallel data output lines P1 through Pn is coupled to a row of memory cells 14 in array 12. The serial data output of data shift register 22 on line 108 is coupled to control unit 24a.

Control unit 24a comprises a state machine which generates a plurality of signals to control the operation of configuration means 18a. The signals generated by control unit 24a include: a two-phase clock signal Clk on bus 31 coupled to the clock input terminals of each cell in data input register 20a, to readback select unit 101 and to readback data flip flop 112; a load signal (Load) on line 15 coupled to the load input terminal of data input register 20a; a second two-phase clock signal (Clock) on bus 32 coupled to the clock input terminals of data shift register 22; and a clear signal (Clear) on line 34 coupled to the clear input terminals of stages of data shift register 22 for clearing data shift register 22. In an exemplary embodiment of the prior art, the first clock signal (Clk) may be identical to the second clock signal (Clock).

Those skilled in the art will recognize how to construct control unit 24a from the functional description that follows.

To place shift register into configuration mode, control unit 24a applies a high signal on write line 27. This allows data shift register 22 to shift data. The write signal remains high and the read signal remains low during the entire configuration sequence.

Before data are loaded into data shift register 22, data shift register 22 is cleared to logic "0" by asserting a Clear signal on line 34. The first bit loaded into the first stage 20-1 of data input register 20a is preferably a control bit ("1") and the remaining bits loaded into stages 20-2 through 20-8 are the first seven bits data to be loaded into memory cells 14. Data shift register 22 is then clocked to load the control bit from first stage 20-1 of data input register 20a through readback select unit 101 to first stage 22-1 of data shift register 22. The remaining bits loaded into data input register 20a are serially shifted into data shift register 22 by clocking data input register 20a, readback select unit 101, and data shift register 22 seven more times. This process of loading and serially shifting is repeated once for each eight rows of memory cells 14 in array 12. For example, this process would be repeated at least three times if there were twenty-four rows in array 12.

When control unit 24a shifts the control bit out of the last stage 22-n of data shift register 22, control unit 24a recognizes that data shift register 22 is fully loaded and that the data may be transferred to the column of memory cells 14 of array 12. Control unit 24a then applies an address strobe signal on line 36, to store the data held in data shift register 22 into a column of memory cells 14 in array 12. It continues to assert the strobe signal until control unit 24a detects a control bit on bit stream monitor line 35 which connects to the output terminal of data input register 20a. Control unit 24a then applies the address clock signal on line 37, which causes an address token to be moved to the next column in address register 16. The address token is inserted at the beginning of address register 16 once at the beginning of the configuration process and moves sequentially through the columns to cause each column to be loaded, and finally exits the address register 16. When no token is present in address register 16, address register 16 returns a high AREmp signal on line 38 to indicate that address register 16 is empty and the entire array 12 has been loaded.

Figure 3A:
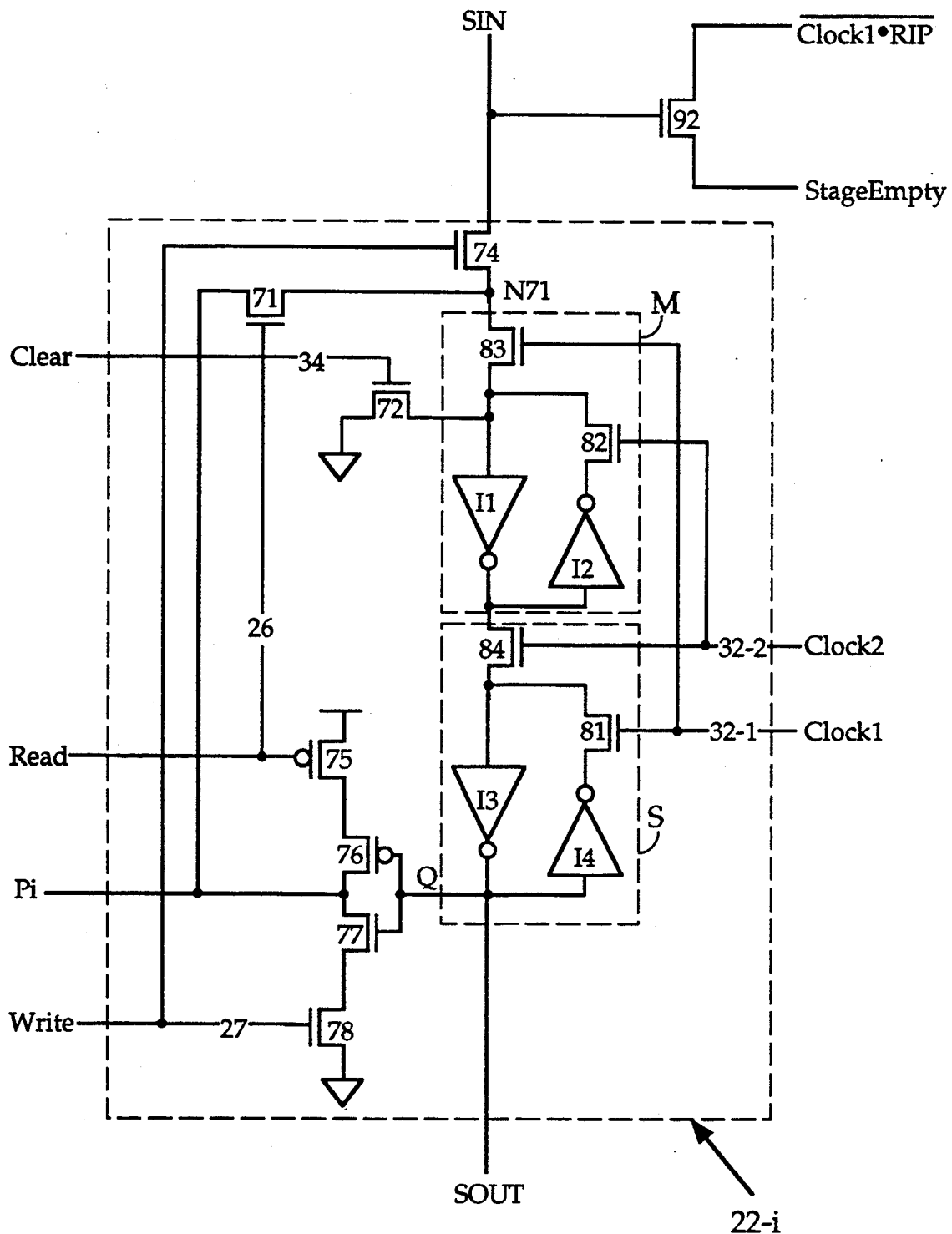
FIG. 3A shows a data shift register bit used in this prior art configuration means.

The prior art structure also allows for reading back data from the array 12. FIG. 3A shows a shift register bit 22-i for such a prior art shift register. Before reading back data, data shift register 22 (FIG. 3, represented in FIG. 3A by shift register bit 22-i) is cleared with a high signal on line 34. At the same time, a high token signal RBToken is loaded on line 29 through OR gate 102 into flip flop 104. The read signal on line 26 is brought low and the write signal on line 27 is brought high, which, as can be seen in FIG. 3A, precharges line Pi (represents lines P1 through Pn) to logic high. The read signal on line 26 is then brought high and the write signal on line 27 is brought low, which turns off the power to transistors 75 through 78, turns off transistor 74, and turns on transistor 71. A high address strobe signal on line 36 applies data from the addressed column on array 12 to lines P1 through Pn. When clock signal Clk1 (on line 32-1 of 2-bit bus 32) goes high, line Pi drives the input terminal N71 of master latch M and the data value is stored in master latch M. The address strobe signal on line 36 is then brought low and Clk1 is brought low. When Clk2 goes high, the data bit shifts to slave latch S.

During this time, the low write signal on line 27 has held transistor 74 off so that data do not shift along the shift register. The shift register is now loaded with one bit for each row in the addressed column, and the next operation will be to shift this column of data out of the shift register. Next, the read signal on line 26 is brought low and the write signal on line 27 is brought high so that data shift from one stage to the next in data shift register 22. Clk1 and Clk2 alternately are brought high (with non-overlapping clock signals) so that data shift downward and out onto line RBData. Shifting continues until the column of data is shifted entirely out. Completion of shifting is detected when the DREmpty signal appears at the output of register R8. Another column is addressed, loaded, and shifted and the process is repeated until all columns have been shifted out.

Parallel Input Shift Register with Staggered Shifting Structure .

The present invention is directed to an improved configuration means (see structures 18b–18f in FIGS. 4, 5, 6, 7, and 8) and control unit 24b–24f that provide a significantly reduced loading time. Configuration means 18b–18f of the present invention can be loaded with a column of data in about a half to an eighth of the time required by the prior art. The present invention also reduces the number of control signals control unit 24b–24f must generate, thereby reducing its complexity.

Figure 4:
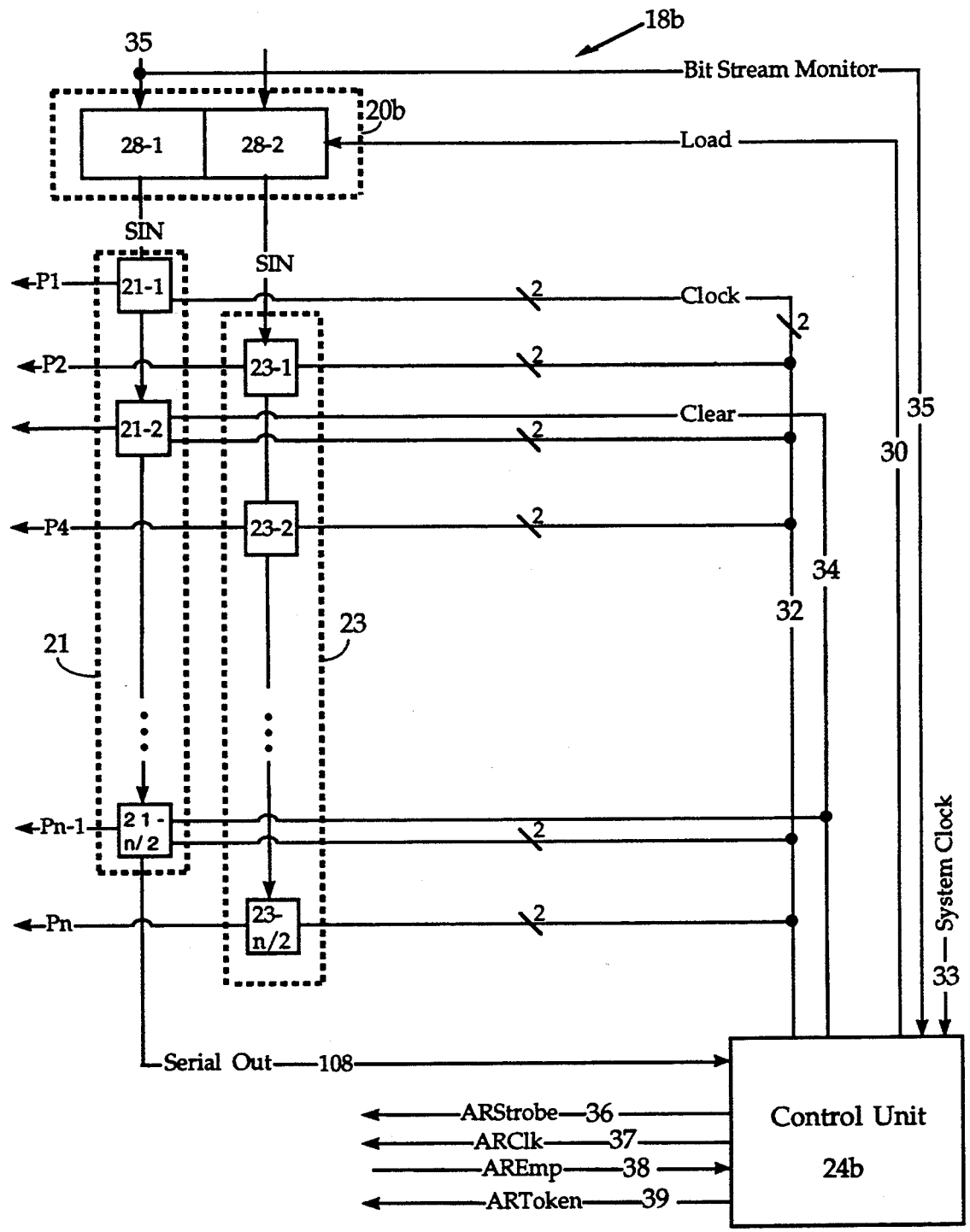
FIG. 4 is a block diagram showing a first embodiment of a configuration means for the array of memory cells constructed according to the present invention.

Referring now to FIG. 4, a block diagram of a first embodiment of the present invention is shown. The first embodiment of configuration means 18b comprises a data input register 20b, a first shift register 21, a second shift register 23, and a control unit 24b. Control unit 24b generates a Load signal on line 30 for parallel loading of data input register 20b, a two-phase clock signal on 2-bit bus 32 for serially loading first shift register 21 and second shift register 23 in parallel, and a Clear signal on line 34 for clearing first shift register 21.

Data input register 20b is preferably a parallel in, parallel out data register made up of flip flops. The first embodiment of data input register 20b has two flip flops 28-1, 28-2. Those skilled in the art will realize that data input register 20b may be other digital storage means. Data input register 20b has a load input, a plurality of data inputs and a plurality of data outputs. The load input of data input register 20b is coupled to Load line 30 to receive the Load signal from control unit 24b. Data are loaded simultaneously into both stages 28-1, 28-2 of data input register 20b in response to the Load signal. The plurality of data input terminals are coupled to receive data that are to be loaded into memory cells 14. Data input register 20b receives one word of data, in this case a word of two bits.

The first shift register 21 and second shift register 23 are similar, and are preferably serial in, parallel out shift registers. First shift register 21 preferably has a serial input terminal SIN, a clear input terminal, two clock input terminals, and a plurality of odd-numbered output terminals P1 through Pn-1. Second shift register 23 preferably has a serial input, two clock input terminals, and a plurality of even-numbered output terminals P2 through Pn. Each of shift registers 21, 23 in the present invention has a number of stages 21-1 through 21-n/2 and 23-1 through 23-n/2 equal to n/m, where n is the number of rows of array 12 and m is the number of shift registers in configuration means 18b. The present invention replaces a single n long shift register with m shift registers n/m long. Thus in the first embodiment, the number of stages 21-1 through 21-n/2 and 23-1 through 23-n/2 in each of shift registers 21, 23 is half that of a prior art shift register 22 for an array 12 having the same number of rows. Therefore, the embodiment of FIG. 4 reduces the time required to load configuration means 18b by about half. In another embodiment having more than two shift registers, the time savings is even greater than 2:1.

Each one of the plurality of outputs of data input register 20b is coupled to the serial input of a different shift register 21, 23. For example, the output of data input register bit 28-1 is coupled to first shift register 21, and the output of data input register bit 28-2 is coupled to second shift register 23. Thus, the data may be loaded in parallel to shift registers 21, 23. First shift register 21 and second shift register 23 are arranged in parallel and their outputs are staggered. That is, shift registers 21 and 23 load alternate rows of configuration memory array 12 of FIG. 2. Each output of first shift register 21 and second shift register 23 is connected to a different row bus 15 for coupling each stage 21-1 through 21-n/2 of first shift register 21 and each stage 23-1 through 23-n/2 of second shift register 23 to a different row of memory cells 14 in array 12. First stage 21-1 of first shift register 21 is coupled to the first row of array 12. First stage 23-1 of second shift register 23 is coupled to the second row of array 12. The remaining stages 21-2 through 21-n/2 of first shift register 21 and the remaining stages 23-2 through 23-n/2 of second shift register 23 are similarly coupled in a staggered manner. The last stage 21-n/2 of first shift register 21 is also coupled to control unit 24b.

The clock input of both first shift register 21 and second shift register 23 are coupled to bus 32 for receiving a two phase clock signal from control unit 24b. While clock bus 32 is shown as being connected to each stage 21-1 through 21-n/2 and 23-1 through 23-n/2 of shift registers 21, 23, those skilled in the art will realize that portions of this line 32 may be internal to shift registers 21, 23, and that bus 32 may be a single line coupled to a single clock input of each shift register 21, 23. In response to a clock signal on the clock input bus 32, shift registers 21, 23 serially shift the data one stage and load the data on the serial input lines SIN into first stage 21-1, 23-1.

The clear input of first shift register 21 is coupled to line 34 for receiving a clear signal from control unit 24b. Note that clear line 34 is not coupled to the first stage 21-1 of shift register 21. This connection is not needed in an embodiment which clears shift register 21 at the same time a control bit is being loaded into stage 21-1 of shift register 21. In response to a signal on the clear input, shift register 21 clears stages 21-2 through 21-n/2 by storing logical 0 bits in them.

Control unit 24b is similar to control unit 24a of FIG. 3. Whereas control unit 24a had a Serial Out signal taken from bit 22-n of shift register 22, control unit 24b has a Serial Out signal taken from last stage 21-n/2 of first shift register 21. In addition to the address control signals of FIG. 3, control unit 24b of FIG. 4 generates a two-phase Clock signal on bus 32, a clear signal on line 34, and a Load signal on line 30.

The clock signal (Clock) on bus 32 is halted when data are to be written from shift registers 21, 23 into a column of the memory array 12. In another embodiment, the Load signal on line 30 is also halted when data are to be written to the memory cells. Note that no Clk bus 31 is provided. Thus flip flops 28-1 and 28-2 are simpler structures than the flip flops in register 20a of FIG. 3. In one embodiment, flip flops 28-1 and 28-2 comprise D-flip flops with the Load signal on line 30 applied to the clock input of each D-flip flop.

Note also that in FIG. 4, no Write signal or Read signal (see lines 26 and 27 in FIG. 3) are provided to shift registers 21, 23. Since register 20b does not have to support serial-out shifting, the shift register bit for FIG. 4 is simpler than shown in FIG. 3A. A standard CMOS inverter replaces the switches inverter comprising transistors 75-78 of FIG. 3A and transistors 71, 74, and 92 of FIG. 3A are not provided.

Figure 4A:
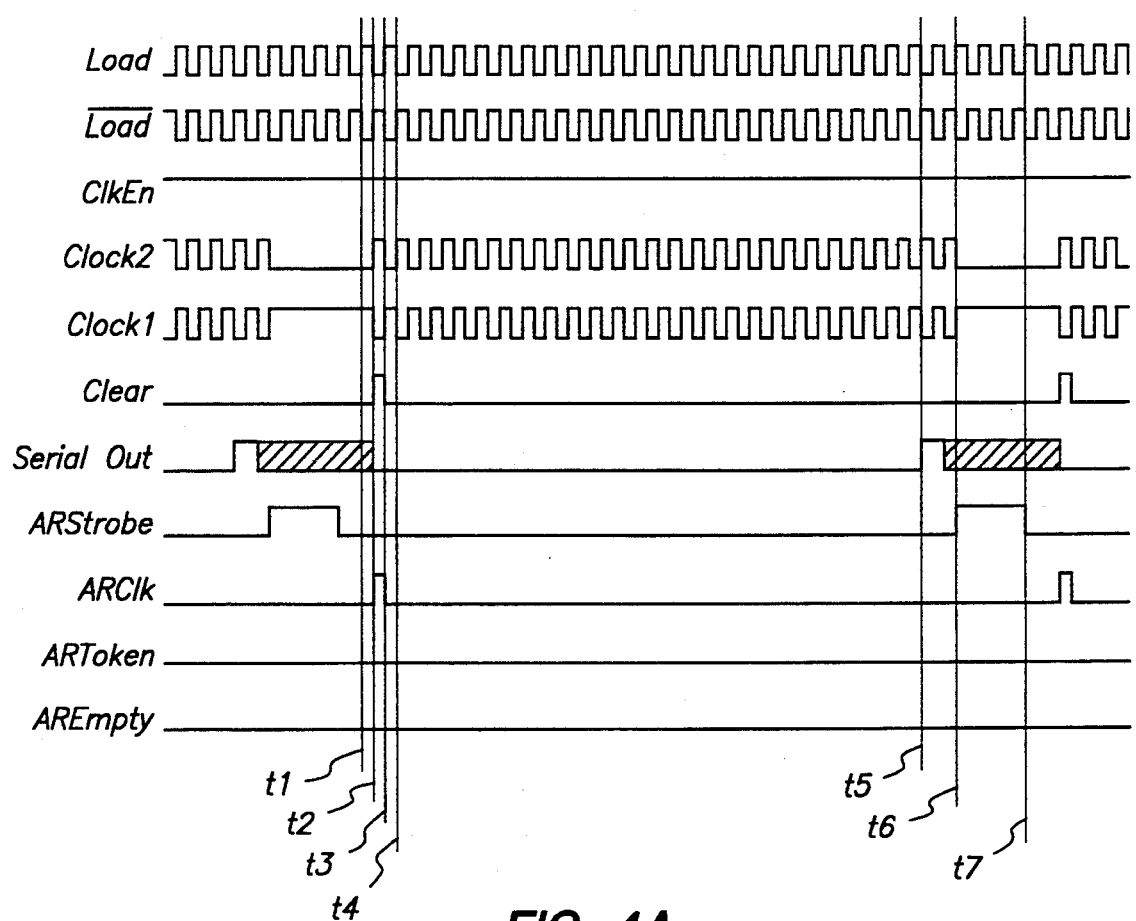
FIG. 4A is a timing diagram of the signals issued by the embodiment of the control unit shown in FIG. 4.

The operation of control unit 24b can best be understood with reference to the timing diagram of FIG. 4A. FIG. 4A refers to the input and output signals at control unit 24b. For an embodiment having 25 stages in each shift register 21 and 23, FIG. 4A illustrates the timing diagram for loading slightly more than one frame of data into each data shift register 21 and 23.

First, at time t1, control unit 24b loads the first bit of the bit stream into the data input register flip flop 28-1 of data input register 20b by asserting the load signal. The first bit of every frame is a control bit (logic high) and is always provided as the first bit in the bit stream. The control bit has two functions: as an indicator to control unit 24b that a complete frame has been loaded and as an indicator to control unit 24b that a new frame is present in the data stream. Control unit 24b also loads a bit into flip flop 28-2, but its value is unimportant in this embodiment because it will not be used as a data bit and will not be used by control unit 24b for any purpose.

At time t2, control unit 24b clears most of shift register 21 by asserting the Clear signal and loads the control bit from data input register flip flop 28-1 into the first stage 21-1 of shift register 21. Thus in this embodiment, no clear signal is provided to stage 21-1 because the control bit is loaded into stage 21-1 at the same time the rest of register 21 is cleared.

Next, at time t3, control unit 24b again asserts the Load signal while a bit of each bit stream of data is applied to each flip flop 28-1 and 28-2 of data input register 20b. This loads two bits of data into data input register 20b. Also at time t3, the high Clock1 signal on Clock bus 32 shifts the control bit into the master latch of second stage 21-2 of shift register 21.

Next, at time t4, control unit 24b asserts the Clock2 signal alternately with asserting the Clock1 and Load signals to shift the remaining bits of the column of data into shift registers 21, 23 through data input register 20b.

At time t5, the control bit is present in last stage 21-n/2 and is detected by control unit 24b, as indicated by the Serial Out signal being asserted. Thus, data input register 20b and shift registers 21, 23 are loaded and clocked one last time before the data are sent to memory cells 14.

At time t6, shift registers 21, 23 contain the entire column of data. Thus, the column of data is transferred from shift registers 21, 23 into memory cells 14 by asserting the ARStrobe signal. The shaded region on the Serial Out line indicates that the data bit being input into control unit 24b, may have either value. This data bit remains in stage 21-n/2 until cleared by the next Clear signal.

Finally, at time t7 the ARStrobe signal becomes deasserted. In one embodiment, control unit 24b counts a number of cycles, for example three cycles, before deasserting the ARStrobe signal. In another embodiment the ARStrobe signal remains asserted until a control bit is detected in the bit stream. In FIG. 4, bit stream monitor line 35 provides the bit stream to control unit 24b for this monitoring purpose.

Using an example of an array 12 of memory cells that has fifty rows, the embodiment of FIG. 4 requires 29 clock cycles to reconfigure a column of memory cells 14. By contrast, the prior art configuration means 18a shown in FIG. 3 requires 54 clock cycles to load a column of data into array 12. The number of cycles saved is even more dramatic in an actual case where array 12 of memory cells 14 is comprised of hundreds of rows.

Additional Embodiments

Figure 5:
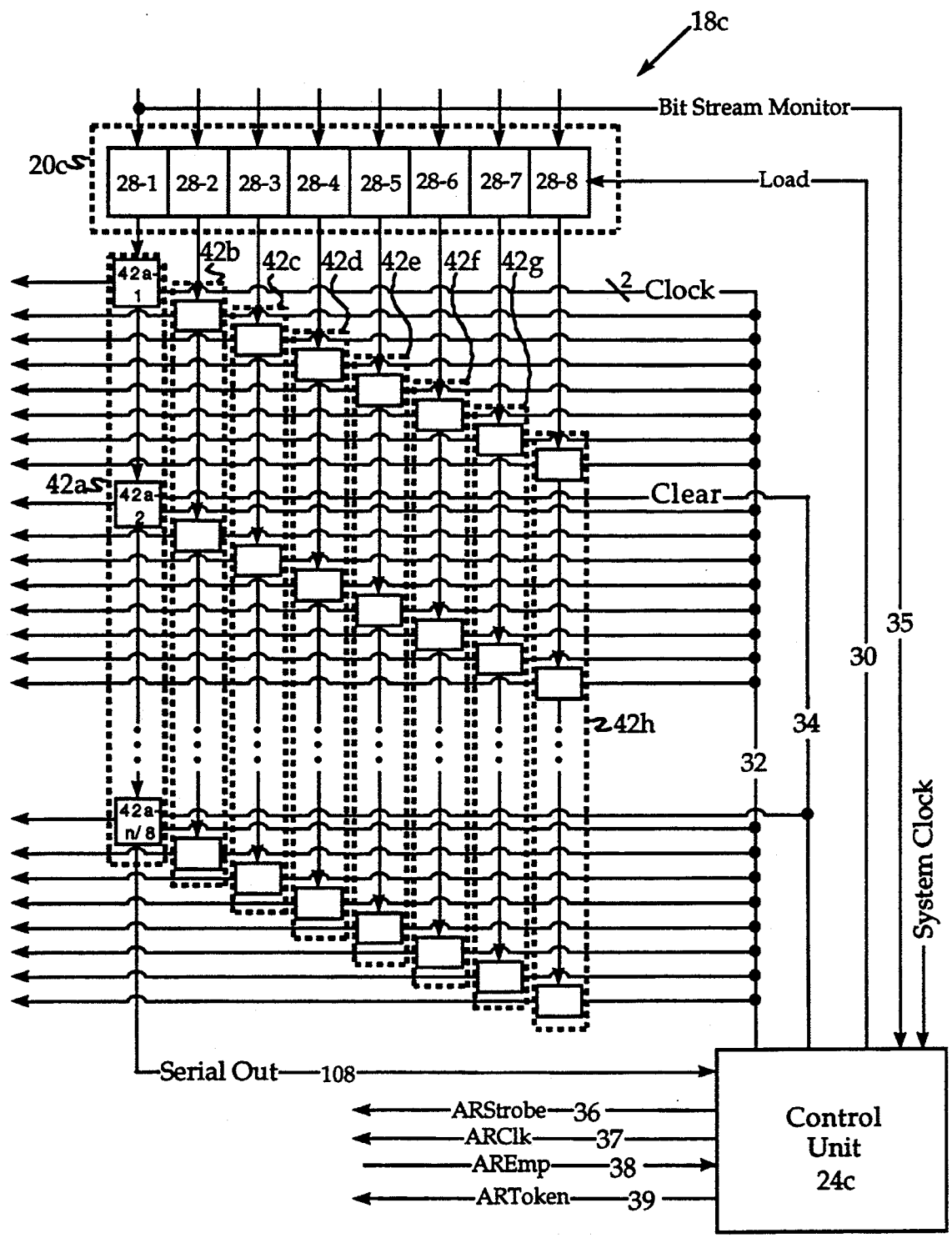
FIG. 5 is a block diagram showing a second embodiment of the configuration means for the array of memory cells constructed according to the present invention.

Referring now to FIG. 5, a block diagram of a second embodiment of the present invention is shown. The second embodiment of configuration means 18c comprises a data input register 20c, eight shift registers 42a–42h, and a control unit 24c. Control unit 24c provides the same control signals as the first embodiment, and except for the bit stream monitor signal receives the same input signals. Like names and numbers have been used to indicate like signals and lines.

Data input register 20c is similar to data input register 20b of the first embodiment in that it is a parallel in, parallel out data register. However, data input register 20c has eight storage devices 28-1 through 28-8, and thus, eight data input terminals and eight data output terminals. Each storage device is preferably a flip-flop that stores one bit of data. Data input register 20c holds eight-bit words that are portions of a column of data to be stored in array 12. The eight input terminals are coupled to receive data for storage in array 12, and each of the eight output terminals is coupled to a respective shift register 42a–42h. Data input register 20c also has a Load input terminal that is coupled to line 30 for receiving the Load signal from control unit 24c.

The shift registers 42a–42h are similar to shift registers 21, 23 of the first embodiment in that they are serial in, parallel out shift registers. In the second embodiment, each shift register 42a–42h has n/8 stages, where n is the number of rows in array 12. Thus, in the embodiment of FIG. 5 a column of data can be loaded into array 12 in about one eighth the time required by the prior art. Each of shift registers 42a–42h has a serial input terminal, clock input terminals and a plurality of parallel output terminals. The first shift register 42a also has a clear input terminal for clearing stages 42a-2 through 42a-n/8 of first shift register 42a while a control bit is serially shifted into first stage 42a-1. The clear input terminal of first shift register 42a is coupled to line 34. The serial input terminal of each shift register 42a–42h is coupled to a respective output terminal of data input register 20c. The clock input terminals of shift register 42a–42h are coupled to bus 32 to receive the clock signal from control unit 24c. An output terminal of each stage of shift registers 42a–42h is coupled to a row of memory cells 14 of array 12. Shift registers 42a–42h are preferably arranged in parallel and with their output terminals staggered. Thus, the output terminal of first stage 42a-1 of first shift register 42a is coupled to the first row of memory cells 14 of array 12. An output terminal of first stage 42b-1 of second shift register 42b is coupled to the second row of memory cells 14 of array 12. The output terminals of first stages 42c-1 to 42h-1 of remaining shift registers 42c–42h are similarly coupled to the third through eighth rows of array 12, respectively. In an embodiment where there are 8 shift registers 42a–42h, second stage 42a-2 of first shift register 42a is coupled to the ninth row of memory cells 14, and second stage 42b-2 of second shift register 42b is coupled to the tenth row of memory cells 14. This coupling is repeated for the remaining stages and rows of memory cells 14. Those skilled in the art will realize that the output terminals of shift registers 42a–42h could be coupled to the rows of array 12 in a variety of different configurations as long as each output terminal is coupled to a different row. The output terminal of last stage 42a-n/8 of first shift register 42a is also coupled to control unit 24c.

Control unit 24c used in FIG. 5 is similar to and may be the same as control unit 24b in FIG. 4. As shown in FIG. 5, control unit 24c provides the load, clear, clock and address signals for storing a column of data in a column of memory cells 14. One notable difference with control unit 24c is the number of times shift registers 42a–42h are repeatedly clocked to temporarily store the data in shift registers 42a–42h before transfer to memory cells 14. In the first embodiment, shift registers 21, 23 were clocked n/2 times where n is the number of rows in array 12. However, in the second embodiment, shift registers 42a–42h need only be clocked n/8 times to load a column of data into shift registers 42a–42h. This greatly reduces the overall time required to reconfigure array 12.

Control unit 24c preferably asserts the above-identified signals to perform the following operations for loading a column of data into a column of memory cells 14. Eight bits of data at a time are loaded into data input register 20c. On a first clock cycle, a control bit is loaded into flip flop 28-1 of data input register 20c by asserting the load signal on line 30. In the first half of the next clock cycle, the control bit is loaded into the master portion of stage 42a-1 of first shift register 42a. On the second half of this next clock cycle (when the master and slave portions of a flip flop are connected), the control bit shifts into the slave portion of stage 42a-1. At this time, a Clear signal is asserted on line 34, which clears the remaining stages of first shift register 42a. On this same clock cycle, the load signal and the clock signal are asserted to load an eight bit word into data input register 20c. For about the next n/8 clock cycles, the load signal and the clock signal are asserted to load data into data input register 20c and shift it into shift registers 42a–42h. Upon the next clock cycle after the control bit is shifted out of last stage 42a-n/8 of first shift register 42a, control unit 24c, by asserting the ARStrobe signal on line 36, transfers the data in shift registers 42a–42h to a column of array 12.

Figure 6:
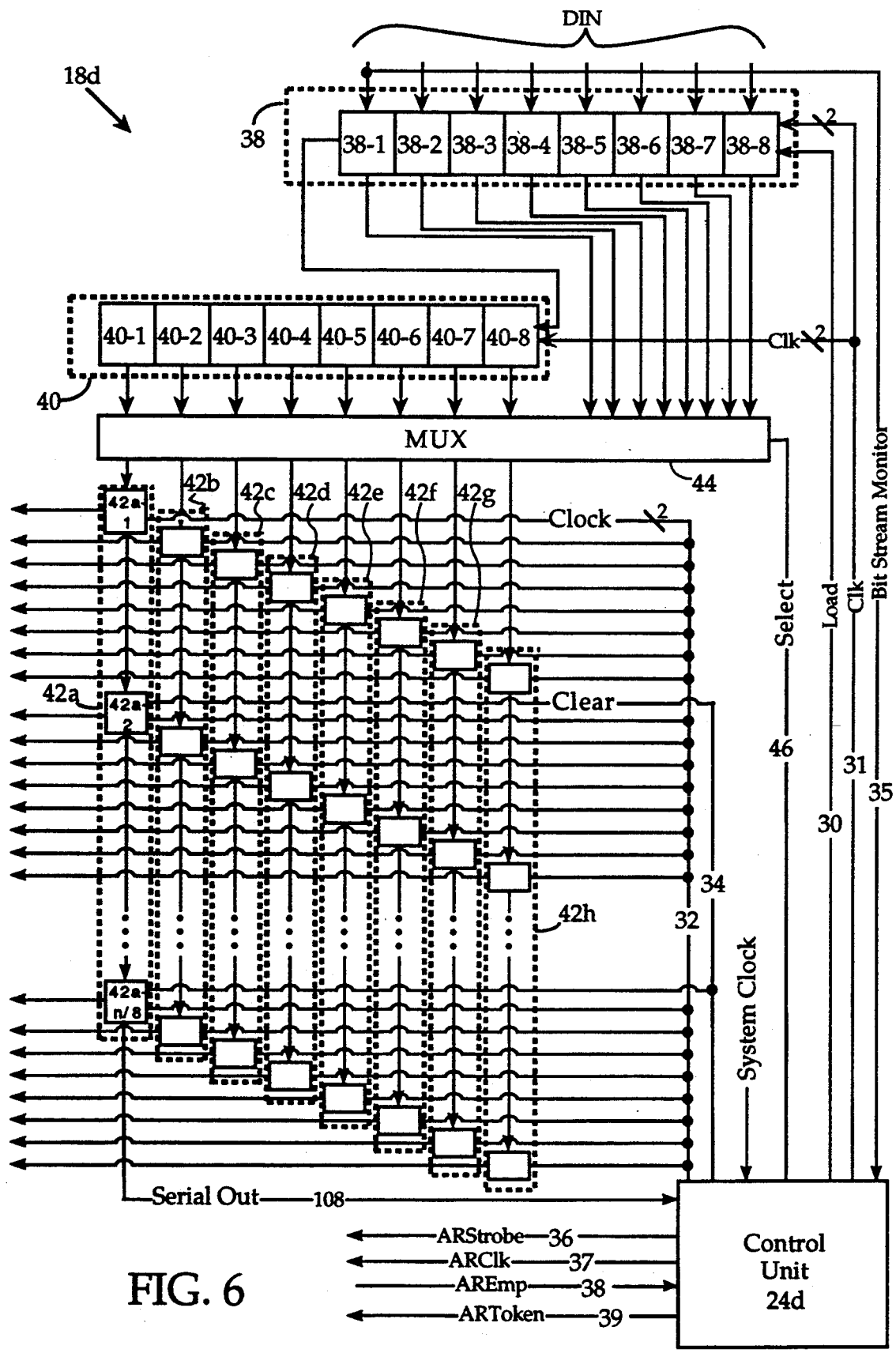
FIG. 6 is a block diagram showing a third embodiment of the configuration means which provides both eight-bit parallel loading and serial loading.

Referring now to FIG. 6, a block diagram of a third embodiment of the present invention is shown. FIG. 6 shows an embodiment that also provides backward compatibility for reconfiguring the array of memory cells serially with timing similar to the prior art. Providing timing similar to the prior art may be useful for configuration equipment that cannot provide the parallel data as fast as is possible with the present invention. In FIG. 6, configuration means 18d comprises a first data register 38, a second data register 40, eight shift registers 42a–42h, a multiplexer 44, and a control unit 24d.

The first data register 38 is preferably a parallel input shift register with a plurality of data input terminals, a serial output terminal, and a plurality of parallel output terminals. FIG. 7B shows how one stage of first data shift register 38 may be formed. In particular, first data register 38 is an eight stage shift register with a single serial output terminal and eight parallel output terminals. First data register 38 also has a load input terminal connected to line 30 for loading eight bits into register 38 and clock input terminals connected to bus 31 for shifting the data in register 38 one bit to the left. The data input terminals DIN are coupled to receive data that are to be loaded into memory cells 14.

The second data register 40 is a serial in parallel out shift register. In particular, second data register 40 is an eight stage shift register with a single serial input terminal, a clock input terminal and eight parallel output terminals. The serial input terminal of second data register 40 is coupled to the serial output terminal of first data register 38. The clock input terminals are coupled via bus 31 to control unit 24d for receiving a clock signal. In response to the clock signal, second data register 40 shifts data one stage to the left and loads the data at the serial input on the right into first stage 40-1. Data may be serially loaded from first data register 38 to second data register 40. By serially loading second data register 40, the third embodiment of the present invention provides timing similar to the prior art for backward compatibility.

Multiplexer 44 is preferably a 16-to-8 multiplexer having a select input terminal, 16 data input terminals and 8 data output terminals. Those skilled the art will realize that multiplexer 44 could also be a plurality of 2-to-1 multiplexers or other combinations of multiplexers. A first group of eight data inputs of multiplexer 44 are coupled in a one-to-one correspondence with the parallel outputs of first data register 38. The remaining eight data inputs of multiplexer 44 are coupled in a one-to-one correspondence with the parallel outputs of second data register 40. Each of the eight data outputs of multiplexer 44 is coupled to a respective serial input of a shift register 42a–42h. The select input of multiplexer 44 is coupled to control unit 24d by a line 46 to receive a select signal. In response to the select signal, multiplexer 44 outputs either the data from first data register 38 (fast loading mode) or the data from second data register 40 (backward compatible mode).

Control unit 24d is similar to control unit 24c described in connection with FIG. 5. Control unit 24d generates address signals on lines 36-39, a load signal on line 30, first clock signals (Clock) on bus 32, second clock signals (Clk) on bus 31, a clear signal on line 34, and a select signal on line 46. The address signals, the first clock signals, and the clear signal are similar to those in the FIG. 5 embodiment, provide the same functionality and have the same coupling. The other signals are used to select and load data registers 38, 40 that will provide data to shift registers 42a–42h. The second clock signals Clk are used to serially clock both first data register 38 and second data register 40. The load signal Load on line 30 controls parallel loading of first data register 38. The select signal on line 46 controls multiplexer 44 for selecting output signals from data register 38 or 40 to apply to shift registers 42a–42h.

With the embodiment shown in FIG. 6, the present invention can operate in two modes. In the first mode, data are loaded in series or parallel into first data register 38. The data are then shifted in series from first data register 38 into second data register 40. When second data register 40 is fully loaded, the data are transferred in parallel into shift registers 42a–42h. In a second mode, where the advantages of the present invention are utilized, the serial loading of data register 40 is not used. First data register 38 is loaded in parallel with data. The data are then transferred in parallel from first data register 38 directly into shift registers 42a–42h.

Figure 7:
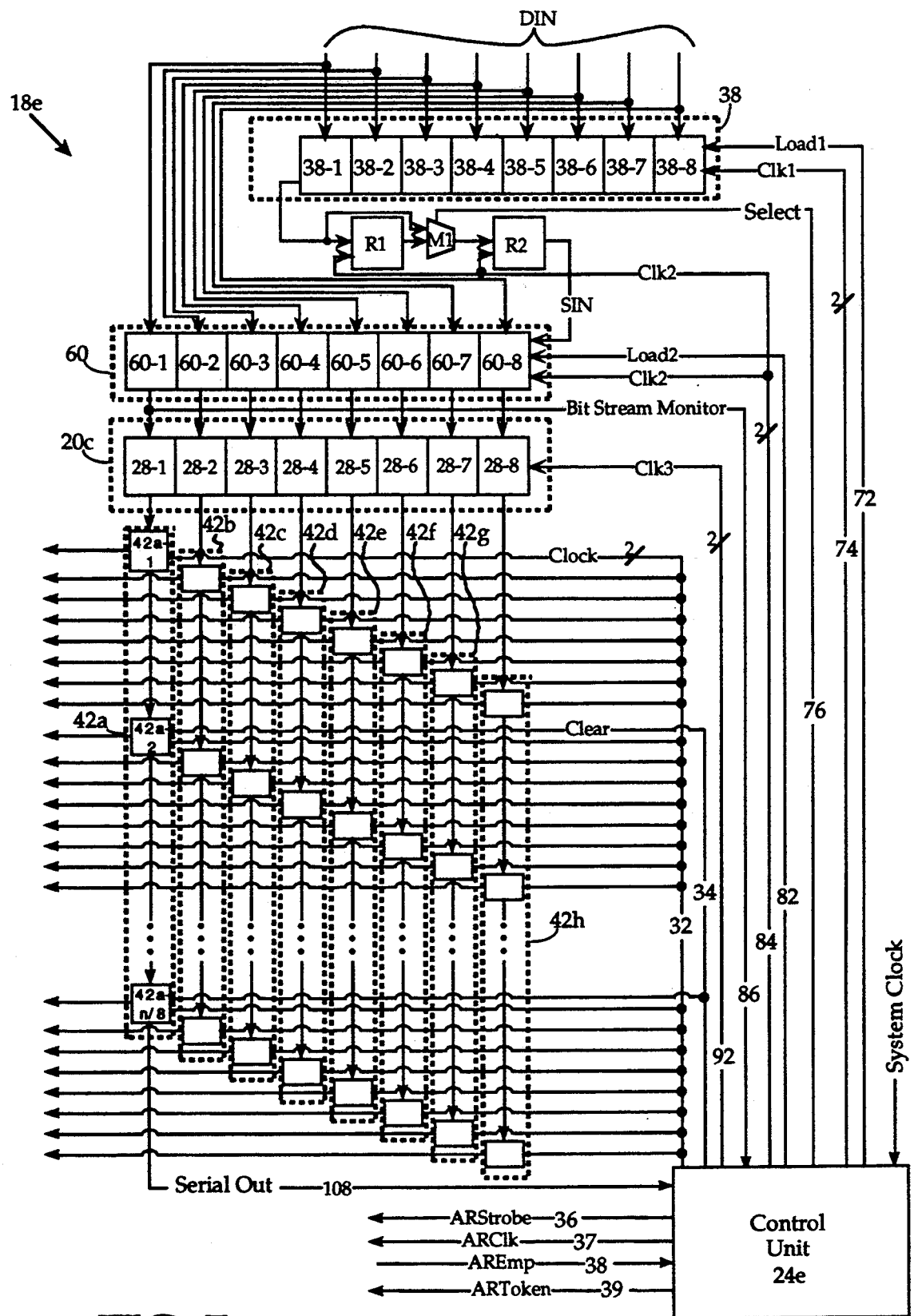
FIG. 7 shows a fourth embodiment of the configuration means which also provides both eight-bit parallel loading and serial loading.

FIG. 7 shows yet another embodiment 18e, which offers a backward compatibility option for systems which cannot load eight bits in parallel at a high clock rate, and a fast loading option for fast systems. Input register 20c and shift registers 42a through 42h are as described for FIG. 5. In FIG. 7, first data register 38 and second data register 60 are coupled differently from the coupling shown in FIG. 6. For timing reasons, input signals DIN to data register 38 are provided directly to register 60. In FIG. 7, no multiplexer 44 is provided. However, register 20c is provided as shown in FIG. 5, and assures timing compatibility between clock signals Clk2 on bus 84 and clock signals Clk3 on bus 92, and further timing compatibility between clock signals Clk3 on bus 92 and the Clock signals on bus 32.

Shift registers 42b through 42h differ from shift register 42a by not including an input terminal for the Clear signal and its related transistor 72 (see FIG. 8C, discussed below).

Figure 7A:
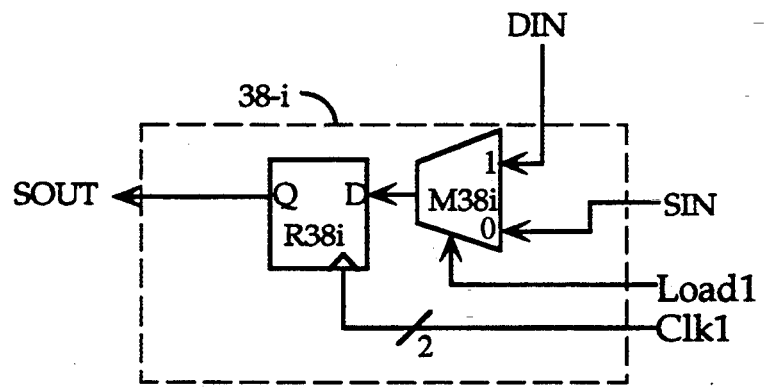
FIGS. 7A and 7B show register bits used in the data registers of FIG. 7.
Figure 7B:
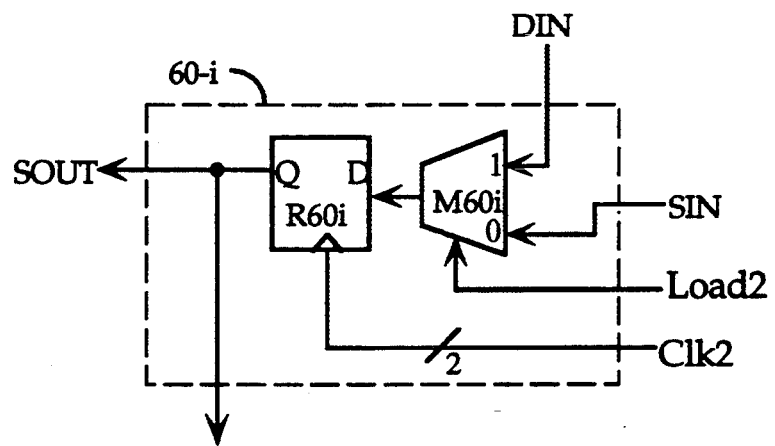

Operation of the circuit of Figure 7 can best be understood in conjunction with FIGS. 7A and 7B. FIG. 7A shows the structure of one of the stages 38-i of first data register 38. As shown in FIG. 7A, the Load1 signal is applied to the select input of multiplexer M38-i and the Clk1 signals are applied to the clock input terminals of flip flop R38-i. For parallel input a data signal DIN is applied to one input terminal of multiplexer M38i. For serial shifting, the output signal SIN from a previous stage is applied to the other input terminal of multiplexer M38i.

Configuration Modes

Circuit 18e of FIG. 7 can operate in several configuration modes. Two configuration modes will be discussed. In parallel configuration mode, the Load2 signal on line 82 is held high. As can be seen in FIG. 7B, the high Load2 signal causes the DIN input to multiplexer M60i (represents the DIN inputs to register stages 60-1 through 60-8 of FIG. 7) to be passed to the D-input terminal of flip flop R60i. At the next clock pulse, the signal is passed to the Q output terminal of flip flop R60i and is thus applied to the D input terminal of a corresponding flip flop in register 20c. The first bit applied to stage 28-1 is a control bit, and this control bit is detected by control unit 24d on bit stream monitor line 86. (This signal is used by control unit 24e to deassert the AR-Strobe signal on line 36.) On the next cycle of the Clk3 signal, the control bit is also passed to first stage 42a-1 of shift register 42a. As the control bit is being passed to stage 42a-1, the first eight data bits are being passed to register 20c. At the next cycle of Clk3, these eight data bits are passed to first stages 42a-1 through 42h-1 of shift registers 42a through 42h. Subsequent loading of shift registers 42a through 42h is as described for earlier embodiments. As with earlier embodiments, when the control bit is passed to stage 42a-n/8, it is detected on the Serial Out line by control unit 24e.

In one serial configuration mode compatible with earlier configuration modes used in other FPGA devices, all bits in the bit stream are loaded through stage 38-1 of register 38 and passed serially through register 60 for loading into data shift registers 42a through 42h. In this serial configuration mode, control unit 24e applies a high Load1 signal to line 72 and a low Load2 signal to line 82. The Clk1 and Clk2 signals on buses 74 and 84 are the same signals and the Clk3 signals on bus 92 switches at one eighth of the Clk1 frequency. For timing reasons, it may be necessary to delay the bit stream different amounts for different configuration modes in which the device operates. Multiplexer M1 offers a programmable extra delay cycle. If multiplexer M1 receives a high Select signal on line 76, the bit stream bypasses flip flop R1. If multiplexer M1 receives a low Select signal on line 76, the bit stream loaded into stage 38-1 passes through flip flops R1 and R2 on two sequential clock cycles of the Clk2 signal (same signal as Clk1 in this mode). Since the Load2 signal on line 82 is low, on the next eight clock cycles eight data bits from the bit stream are loaded into the serial input port SIN of register 60. After eight bits are loaded into register 60, clock signal Clk3 on line 92 is brought high, which transfers the eight bits into register 20c. In this configuration mode, the Clk3 and Clock signals (lines 92 and 32) have the same frequency and opposite phases. Thus in each subsequent cycle of Clk3, the bits in each of shift registers 42a–42h are shifted downward one stage.

Other modes can also be used with the embodiment of FIG. 7. For example, in another serial mode, eight data bits are loaded into register 38, then shifted in series through register 60 and in parallel to register 20c. Control unit 24e controls these various modes. One of ordinary skill in the art will understand how to build control unit 24e based on the above description using circuit elements well known in the art.

Embodiment with Readback

A feature which is desired by some users is to read back the configuration data present in the configuration memory cells 14. For reading back data, a reverse process from the configuration process loads data from the memory cells 14 into the data shift registers and shifts the data out through a readback shift register, through other internal circuitry, and eventually to an external pin or pins. For readback, it is not sufficient to clear only the contents of register 42a as was shown in FIGS. 5–7. This is because before reading data from memory cells 14, the bit lines must be precharged. The bit lines are precharged by shift registers 42a–42h by clearing all stages in these shift registers. Clearing places the proper voltage onto bit lines P1 through Pn so that values in memory cells 14 can be accurately read by shift registers 42a–42h. Thus in an embodiment which allows readback all data register flip flops have a Clear input terminal, except for the first stages, which are cleared by loading with zeros from register 20c.

Figure 8:
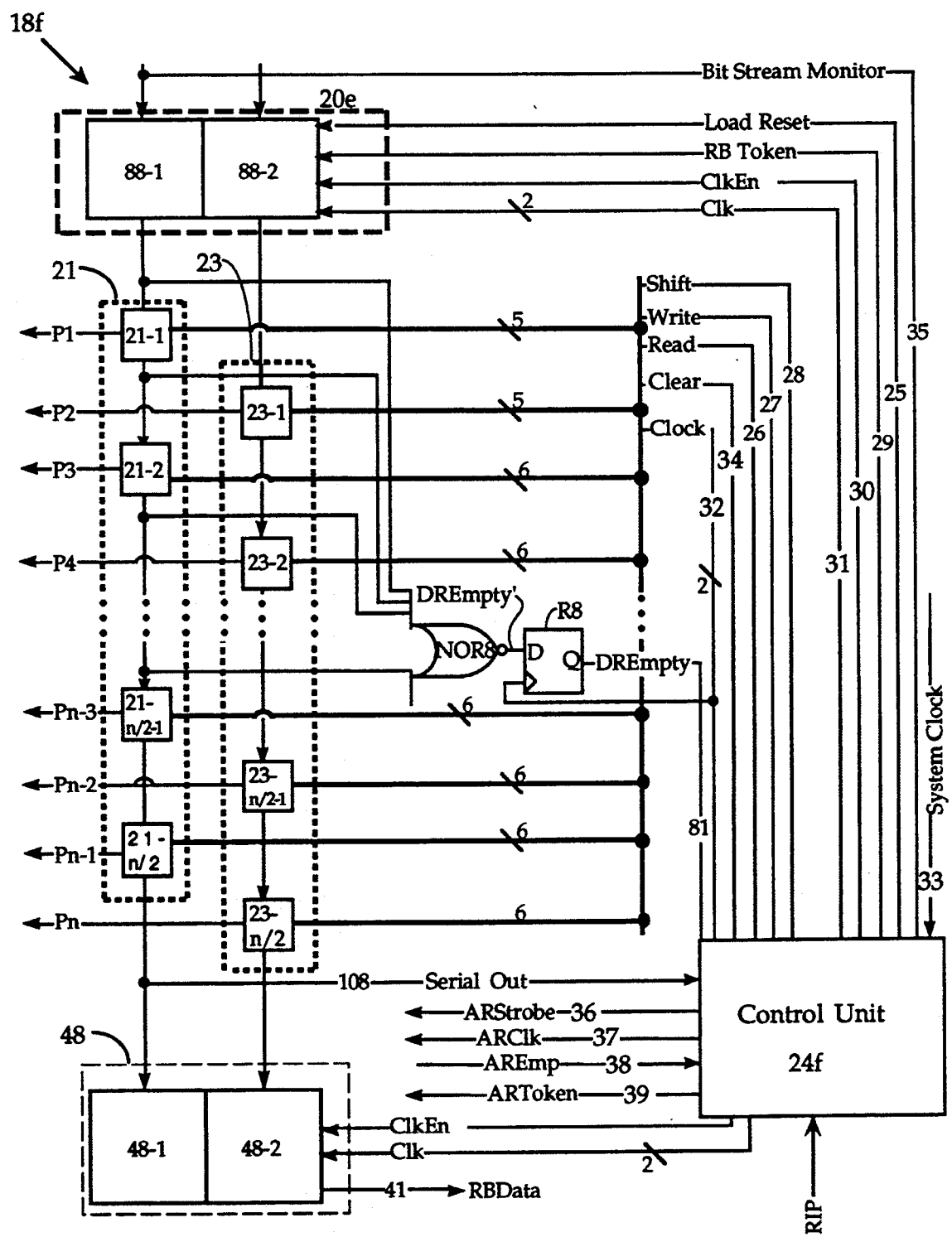
FIG. 8 shows an embodiment of the present invention which includes the readback mode, and provides for serial readback of data in combination with parallel loading of data.

FIG. 8 shows two-shift register embodiment 18f, which includes a readback feature. A parallel-in serial-out readback shift register 48 comprising stages 48-1 and 48-2 receives output data from data registers 21 and 23 and provides the bit stream data. FIG. 8 shows this bit stream data being provided serially on line 41. In another embodiment, shift register 48 may be a parallel-in-parallel-out shift register, and two bit streams will be returned.

Figure 8A:
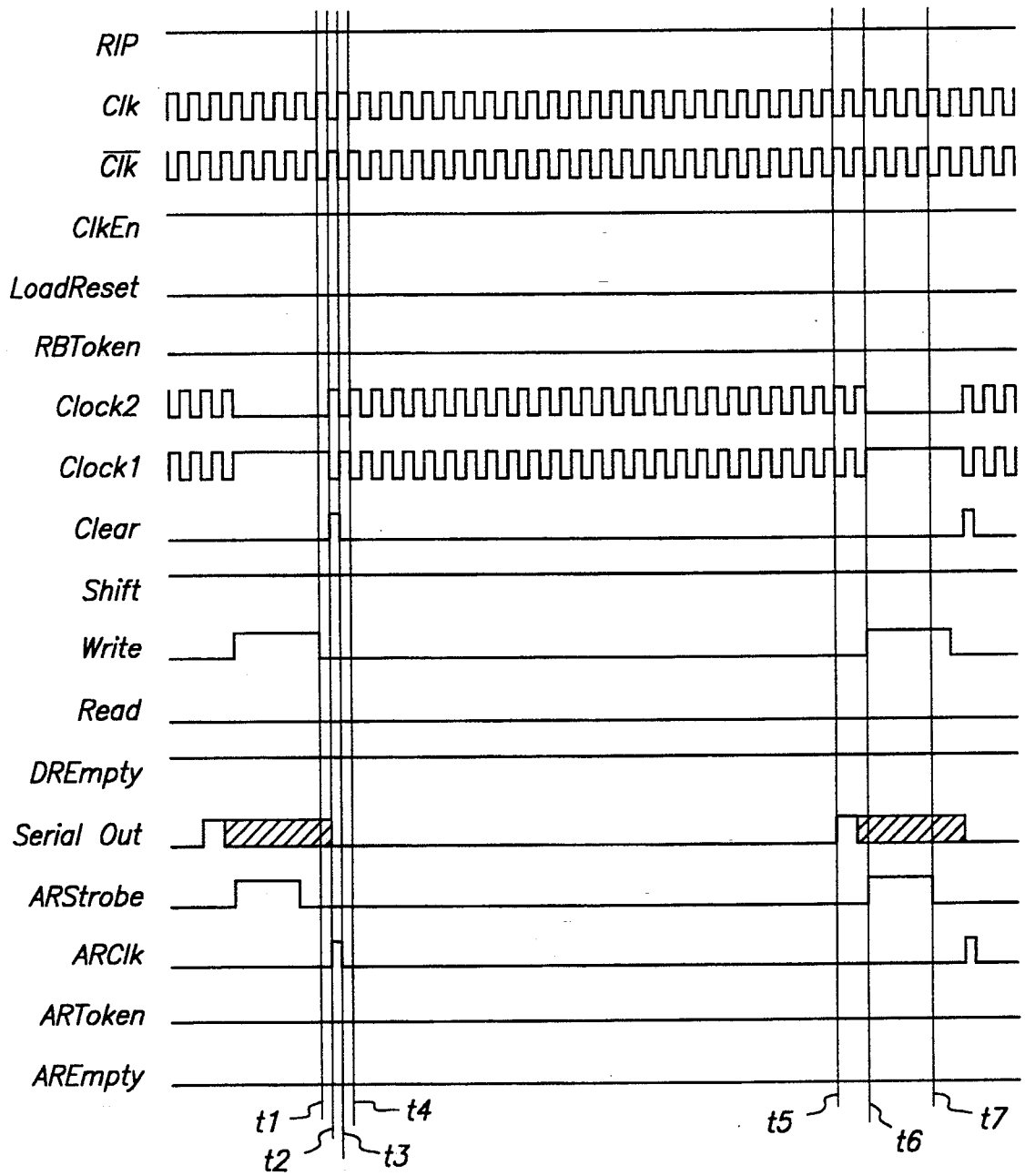
FIG. 8A shows a timing diagram for operating the circuit of FIG. 8 to configure a memory array.
Figure 8B:
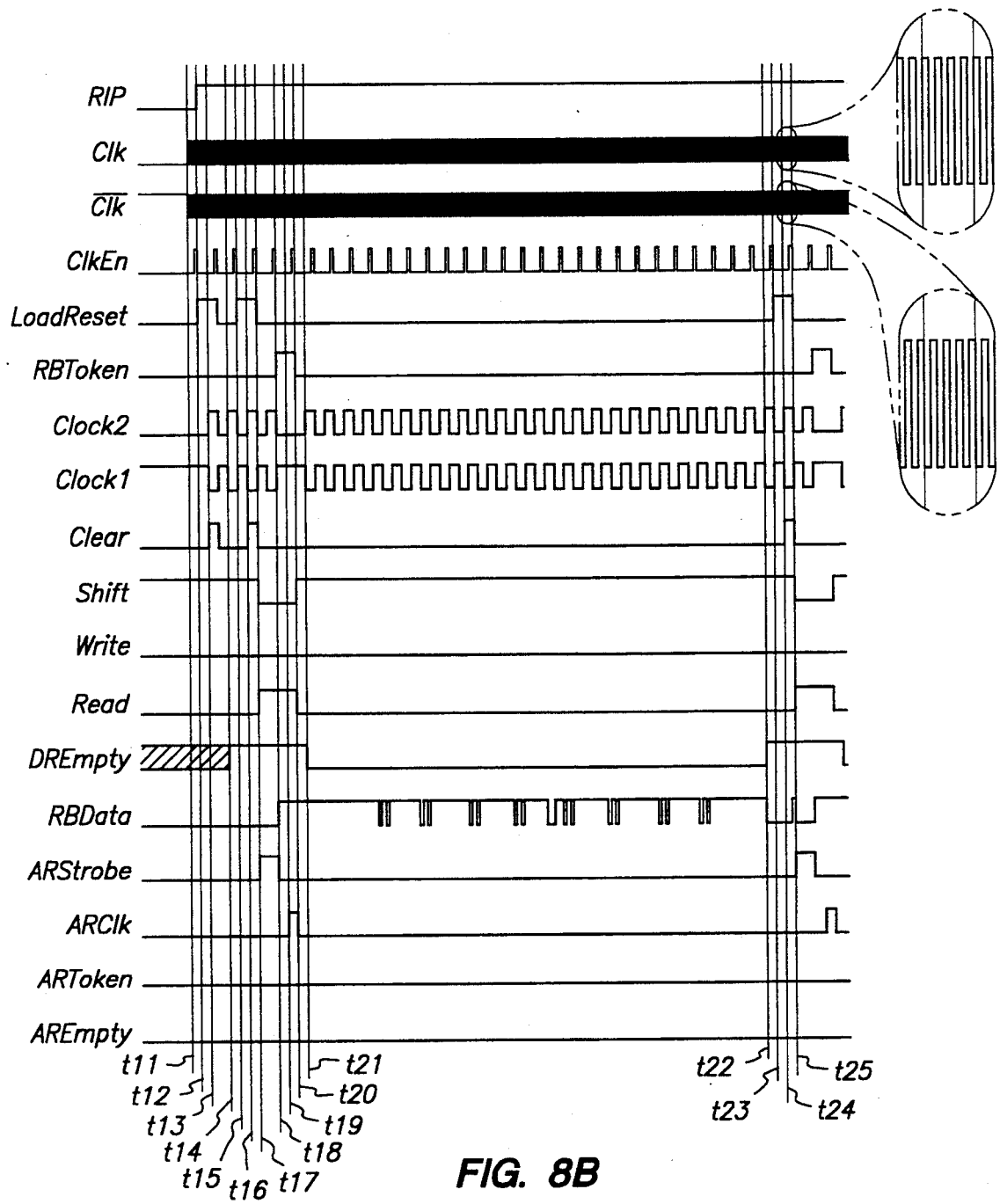
FIG. 8B shows a timing diagram for operating the circuit of FIG. 8 to read back data from the memory array.
Figure 8C:
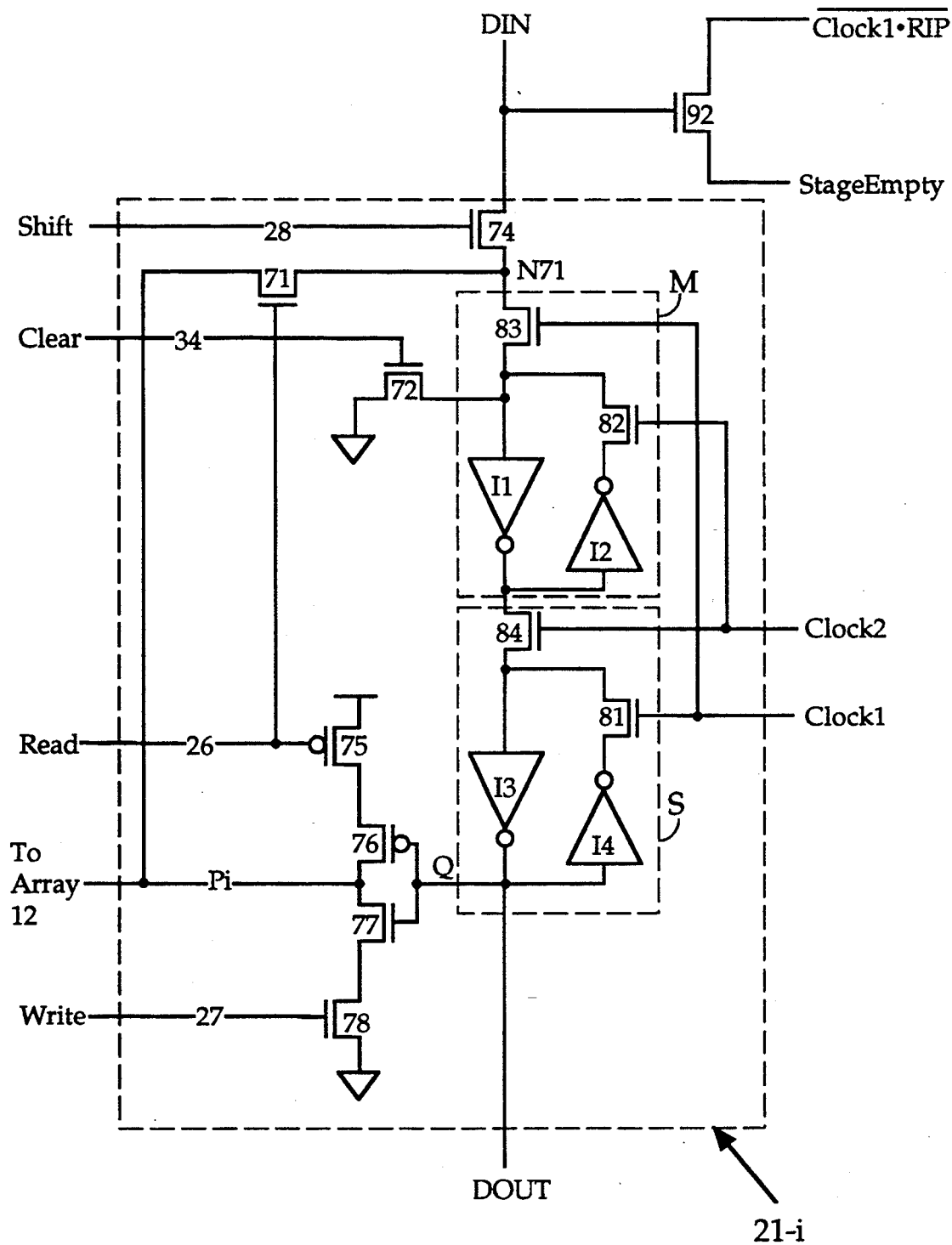
FIG. 8C shows a shift register bit cell for use with FIG. 8.

FIG. 8C shows one of the stages 21-i of shift register 21 of FIG. 8. As can be seen in FIG. 8C, the high Write signal on line 27 in combination with the low Read signal on line 26 causes the output driver comprising transistors 75-78 to be powered up and to provide the data from shift registers 21 and 23 to their respective rows P1 through Pn. The DREmpty' signal provided by NOR gate NOR8 and the DREmpty signal provided by flip flop R8 to control unit 24f is high regardless of data in shift register 21 because NOR gate NOR8 is only powered during readback. Implementation of NOR gate NOR8 of FIG. 8 is also shown in FIG. 8C. Transistor 92, one of which is provided in each stage of shift register 21, acts as an input terminal to NOR gate NOR8. When the signal is high, DREmpty' is high regardless of the value on line SOUT.

Clock1•RIP

The data shift register bit of FIG. 8C can implement each of the register bits in registers 42a through 42h of FIGS. 5, 6, and 7 when the readback feature is to be provided. Stage 21-i is similar to that shown in FIG. 3A, but differs in providing a separate Shift control line 28. With the separate Shift control line 28, it is possible to hold the Write signal on line 27 low during shifting of data through shift registers 21 and 23, and thus eliminate the power consumption which occurs when the value on line Pi switches from high to low and vice versa as data bits shift down shift registers 21 and 23.

FIG. 8A shows a timing diagram representing the function of control unit 24f for controlling the circuit of FIG. 8. The timing diagram of FIG. 8A is similar to that of FIG. 4A. However, additional signals for controlling the readback function are provided. FIG. 8A shows the timing for configuration of the memory cells 14. During configuration, the readback-in-progress signal RIP is low, the clock enable signal ClkEn is high, the Load Reset signal on line 25 applied to flip flops in register 20e is low, the RBToken signal on line 29 is low, the Shift signal on line 28 is high, and the Read signal on line 26 is low. The Write signal on line 27 is low between times t1 and t6, and goes high at time t6 in response to the high Serial Out signal indicating that a frame has been loaded.

FIG. 8B shows another timing diagram representing the function of control unit 24f during readback mode. This figure was generated by a digital logic simulator for a circuit having eight parallel shift registers whereas FIG. 8 has only two parallel shift registers 21 and 23. Therefore in FIG. 8B, signals Clk and $\overline{\text{Clk}}$ switch at eight times the rate of signals Clock1 and Clock2. In the embodiment of FIG. 8, the frequencies would have a two:one ratio. Except for the RBData signal replacing the Serial Out signal, the signals in FIG. 8B are the same as shown in FIG. 8A and have the same names. The timing diagram of FIG. 8B illustrates the signal states just before and near the beginning of a readback sequence. During readback, the frequency of the clock signals Clk and $\overline{\text{Clk}}$ on clock bus 31 is 8 times as high as the frequency of the Clock1 and Clock2 signals on clock bus 32 since the Clk signals control serial readback of data and the Clock1 and Clock2 signals control shifting of data through eight parallel shift registers. Other signals in FIG. 8B also differ from those in FIG. 8A. The ClkEn signal goes high for a single cycle of the Clk signal every eight cycles. The RBData signal switches at eight times the rate of the Clock1 and Clock2 signals since eight bits of data are being shifted out for every shift of data through the shift registers (Of course, in the embodiment of FIG. 8, only two bits are being shifted on the RBData line for every shift of data through the shift registers.)

At time t11, in response to a readback instruction from a user, switching of the Clk signals on bus 31 begins.

At time t12, four Clk cycles after the readback instruction, at the falling edge of the clock enable signal ClkEn on line 30, the read-in-progress signal RIP goes high, placing control unit 24f into a readback mode. As can be seen in FIG. 8C, this high RIP signal also combines with a high Clock1 signal to generate a low $\overline{Clock1 \cdot RIP}$ signal to transistor 92, which in turn provides the active pulldown to NOR gate NOR8 of FIG. 8 (a resistor provides a passive pullup in this NOR gate) and will cause DREmpty' to be pulled low by a logical 1 in any one of the shift register stages. Also the Load Reset signal on line 25 goes high, which clears flip flops 88-1 and 88-2.

Between time t12 and time t13, the logical zero in flip flops 88-1 and 88-2 is passed into the master portion of the flip flop in register stages 21-1 and 23-1.

At time t13, the Clear signal is asserted, which clears all stages of the two shift registers except the first stages. Note in FIG. 8 that there are only five lines in the busses leading to the first stages, where there are six lines in the busses leading to the remaining stages. This difference occurs because no Clear signal is provided to the first stages. No Clear signal is needed because logical zeros are already present in the first stages 21-1 and 23-1. Also at time t13, both Read and Write signals on lines 26 and 27 are zero, so transistors 75 and 76 are on, and transistors 77 and 78 are off. Thus high signals are applied to all lines P1 through Pn by shift registers 21 and 23. This procharges lines P1 through Pn.

Between times t13 and t14, the output of NOR gate NOR8 goes high in response to all stages of register 21 holding logical zeros.

At time t14, the DREmpty signal goes high in response to the high output of NOR gate NOR8.

At time t15, control unit 24f responds to the high DREmpty signal by asserting the Load Reset signal on line 25, which again clears flip flops 88-1 and 88-2.

At time t16, control unit 24f again asserts the Clear signal on line 34, and again procharges lines P1 through Pn.

At time t17, control unit 24f brings the Shift signal on line 28 low, and brings the Read signal on line 26 high. This turns off the precharge to the bit lines since no current path exists through transistors 75-78. This also turns on transistor 71 and turns off transistor 74 so the source of data for stage 21-i (stages 21-1 through 21-n/2 and stages 23-1 through 23-n/2 becomes the corresponding line Pi. During reading of memory cells 14, the address voltage applied to the gates of the memory cells 14 (see address line A in FIG. 2A) is lower than during writing so that data in memory cells 14 are not destroyed by reading. This relationship of voltage levels is discussed in U.S. Pat. No. 4,750,155. Also on this clock cycle, the address strobe signal ARStrobe on line 36 is asserted, which applies the data in the selected column of memory cells 14 to the lines P1 through Pn. Since the Clock1 signal is high, this data passes directly into all master stages of the registers 21 and 23.

At time t18, control unit 24f applies a logical one readback token RBToken on line 29 into flip flop 88-1 and deasserts the address strobe signal ARStrobe on line 36, which disconnects the column of memory cells from shift registers 21 and 23.

At time t19, control unit 24f asserts the address clock signal ARClk on line 37. This shifts the address token one column in address register 16 so that on the next cycle of events the next column of data in memory cells 14 will be loaded into shift registers 21 and 23.

At time t20, control unit 24f deasserts the RBToken signal on line 29, so that zeros will be loaded by flip flops 88-1 and 88-2 into shift register 21 as data are shifted out. Also, at time t20, control unit 24f brings the Read signal on line 26 low and the Shift signal on line 28 high, which switches the source of data into registers 21 and 23 from memory cells 14 (from Pi in FIG. 8C) to the stage above (to DIN).

At time t21, flip flop R8 provides a low DREmpty signal on line 81 to indicate to control unit 24f that data are present in the shift registers, in particular, to indicate that a logical high is present in shift register 21. Between times t21 and t22, the column of data are being shifted into register 48 and shifted out under control of the faster clock Clk onto line 41.

At time t22, the DREmpty signal goes high, indicating that all data have been shifted out of the shift registers 21 and 23. Note that no input lines to NOR gate NOR8 are provided from the last two stages 21/n/2-1 and 21-n/2. This is because NOR gate NOR8 should begin receiving all low signals as soon as the RBToken control bit (logical high) has moved out of the slave portion of stage 21-n/2-2. When the RBToken moves to the last stage 21-n/2, all data have been shifted into register 48. The high output signal from NOR gate NOR8 is shifted to the Q output of flip flop R8. The high DREmpty signal on line 81 at the output of flip flop R8 indicates that the next column of data in memory cells 14 may be loaded into the shift registers and read back.

FIG. 8B shows the RBData signal going high for the first time at time t18. From times t18 to time t23, the actual value of the RBData signal depends upon data being read out from memory cells 14. The illustration in FIG. 8B shows mostly logical ones, and four zero bits between times t22 and t23. Between times t23 and t25, the RBData signal shows seven control bits of zero followed by the RBToken logical one bit.

While the present invention has been described with reference to certain preferred embodiments, those skilled in the art will recognize that various modifications may be provided. For example, any number of shift registers greater than one may be used. Additionally, the invention is fully applicable to other embodiments for loading memory cells such as where the memory cells are loaded by row instead of by column. Or a row or column may be divided into segments and the segments loaded in parallel or separately. These and other variations upon and modifications to the embodiments described herein are provided for by the present invention, which is limited only by the following claims.

What is claimed is:

1. An apparatus for storing configuration data in a programmable logic device having an array of memory cells arranged in rows and columns, the apparatus comprising:

a means for addressing a selected column of memory cells, the addressing means being coupled to the array of memory cells;

a first shift register having an input and a plurality of outputs for storing and shifting data, each output of the first shift register coupled respectively to a different row of memory cells of the array;

a second shift register having an input and a plurality of outputs for storing and shifting data, each output of the second shift register coupled respectively to a different row of cells of the array; and parallel input means having a first data input, a second data input, a first data output and a second data output, the first and second data inputs coupled to receive data to be loaded in the memory cells, the first data output of the parallel input means coupled to the input of the first shift register and the second data output of the parallel input means coupled to the input of the second shift register.

2. The apparatus of claim 1, wherein each of the first and the second shift registers has a plurality of stages, each stage providing one of the plurality of outputs for the first and the second shift registers.

3. The apparatus of claim 2, wherein the number of stages in the first and second shift registers is equal to about half the number of rows of memory cells in the array.

4. The apparatus of claim 1, further comprising a control unit for controlling the addressing means, the first shift register, the second shift register and the data register, the control unit having inputs and outputs coupled to the addressing means, the data register, the first shift register, and the second shift register.

5. The apparatus of claim 4, wherein the control unit has a load output, a clock output, and a clear output, and the control unit generates signals including:
   a load signal on the load output for controlling the storage of data into the data register, the load output of the control unit coupled to a load input of the data register;
   a clock signal on the clock output for controlling the shifting of data into the first shift register and the second shift register, the clock output of the control unit coupled to a clock input of the first shift register and to a clock input of the second shift register; and
   a clear signal on the clear output for clearing the first shift register and the second shift register, the clear output of the control unit coupled to a clear input of the first shift register and to a clear input of the second shift register.

6. An apparatus for storing configuration data in a programmable logic device having an array of memory cells arranged in rows and columns, the apparatus comprising:
   a means for addressing a selected column of memory cells, the addressing means coupled to the memory cells of the array;
   a plurality of shift registers for storing and shifting data, each shift register having a clock input, a data input and a plurality of data outputs, each shift register serially shifting data in response to a clock signal on the clock input, the data outputs of the plurality of shift registers each coupled to a different respective row of memory cells of the array; and
   a parallel input means having a plurality of data inputs and a plurality of data outputs, the plurality of data inputs of the parallel input means coupled to receive data to be loaded in the memory cells, the plurality of data outputs of the parallel input means each coupled to a respective input of one of the plurality of shift registers.

7. The apparatus of claim 6, wherein there are eight shift registers, and wherein the number of data outputs provided by the eight shift registers is about equal to the number of rows in the array.

8. The apparatus of claim 7, wherein each of the eight shift registers has approximately the same number of data outputs.

9. The apparatus of claim 6, wherein the data register has eight data stages and each data stage provides a data output.

10. The apparatus of claim 6, further comprising a control unit for controlling the data register to load data in parallel into the data register, for controlling the plurality of shift registers to serially load data into each shift register concurrently, and for controlling the addressing means to load data in parallel to the memory cells, the control unit having at least one input and outputs, the outputs of the control unit coupled to the addressing means, the data register, and the plurality of shift registers.

11. The apparatus of claim 10, wherein the control unit has a load output, a clock output, and a clear output, and the control unit generates signals including:
   a load signal on the load output for controlling the storage of data in the data register, the load output of the control unit coupled to a load input of the data register;
   a clock signal on the clock output for controlling the shifting of data into the plurality of shift registers, the clock output of the control unit coupled to a clock input of each of the plurality of shift registers; and
   a clear signal on the clear output for clearing the plurality of shift registers, the clear output of the control unit coupled to a clear input of each of the plurality of shift registers.

12. The apparatus of claim 11, wherein the control unit has a control input and the control input is coupled to an output of one of the plurality of shift registers for determining when the shift registers have been loaded with a column of data.

13. The apparatus of claim 11 further comprising:
   a second data register having an input and outputs for storing data, the input of the second data register coupled to one of the outputs of the multiple stage data register; and
   a multiplexer having a first set of data inputs, a second set of data inputs and data outputs, the first set of data inputs coupled to the outputs of the multiple stage data register, the second set of data inputs coupled to the outputs of the second data register, and the outputs of the multiplexer coupled to the plurality of shift registers 14. The apparatus of claim 13, wherein the multiple stage data register is a parallel input shift register and the second data register is a serial input, parallel output shift register.

15. The apparatus of claim 14, wherein the multiple stage data register has eight stages and the second data register has eight stages.

16. The apparatus of claim 1 (further comprising) wherein the parallel input means is a two stage data register having a first data input, a second data input, a first data output and a second data output for storing data, the first and second data inputs coupled to receive data to be loaded in the memory cells, the first data output of the data register coupled to the input of the first shift register and the second data output of the data register coupled to the input of the second shift register.

17. The apparatus of claim 6 (further comprising) wherein the parallel input means is a multiple stage data register having a plurality of data inputs and a plurality of data outputs for storing data, the plurality of data inputs of the data register coupled to receive data to be loaded in the memory cells, the plurality of data outputs of the data register each coupled to a respective input of one of the plurality of shift registers.

* * * * *

UNITED STATES PATENT AND TRADEMARK OFFICE
CERTIFICATE OF CORRECTION

PATENT NO. : 5,430,687
DATED : July 4, 1995
INVENTOR(S) : Lawrence C. Hung and Charles R. Erickson It is certified that error appears in the above-indentified patent and that said Letters Patent is hereby corrected as shown below:

Col. 4, line 50, "FPGA 20 logic" should read --FPGA 2, logic--.

Col. 16, line 9, "signal is" should read --signal $\overline{\text{Clock1·RIP}}$ is--.

Col. 16, line 11, "Clock1 RIP" should read -- --.

Col. 17, line 34, "NORS" should read --NOR8--.

Col. 17, line 39, "procharges" should read --precharges--.

Claim 1, col. 19, line 1, "parallel" should read --a parallel--.

Signed and Sealed this

Twenty-eighth Day of November 1995

Attest:

BRUCE LEHMAN

*Attesting Officer*  *Commissioner of Patents and Trademarks*